United States Patent
Izuha et al.

(10) Patent No.: US 9,435,643 B2
(45) Date of Patent: Sep. 6, 2016

(54) PRESUMABLY DEFECTIVE PORTION DECISION APPARATUS, PRESUMABLY DEFECTIVE PORTION DECISION METHOD, FABRICATION METHOD FOR SEMICONDUCTOR DEVICE AND PROGRAM

(71) Applicant: SONY CORPORATION, Tokyo (JP)

(72) Inventors: Kyoko Izuha, Kanagawa (JP); Tatsushiro Hirata, Kanagawa (JP); Shunichi Shibuki, Kumamoto (JP)

(73) Assignee: SONY CORPORATION, Tokyo (JP)

( * ) Notice: Subject to any disclaimer, the term of this patent is extended or adjusted under 35 U.S.C. 154(b) by 7 days.

(21) Appl. No.: 13/754,635

(22) Filed: Jan. 30, 2013

(65) Prior Publication Data

US 2013/0196453 A1 Aug. 1, 2013

(30) Foreign Application Priority Data

Jan. 30, 2012 (JP) .................................. 2012-017041

(51) Int. Cl.
*H01L 21/02* (2006.01)
*G01B 21/02* (2006.01)
*H01L 21/66* (2006.01)

(52) U.S. Cl.
CPC .............. *G01B 21/02* (2013.01); *H01L 22/10* (2013.01); *H01L 22/12* (2013.01); *H01L 2924/0002* (2013.01)

(58) Field of Classification Search
CPC ................................................ H01L 21/76828
See application file for complete search history.

(56) References Cited

U.S. PATENT DOCUMENTS

| 6,259,960 | B1* | 7/2001 | Inokuchi | G01N 21/9501 250/310 |
|---|---|---|---|---|
| 2004/0126909 | A1* | 7/2004 | Obara | G06T 7/0004 438/14 |
| 2007/0109245 | A1* | 5/2007 | Hwang | 345/98 |
| 2011/0261287 | A1* | 10/2011 | Kim | 349/61 |
| 2012/0316855 | A1* | 12/2012 | Park et al. | 703/13 |

FOREIGN PATENT DOCUMENTS

| JP | 2008-010741 | 1/2008 |
|---|---|---|
| JP | 2010-140278 | 6/2010 |

* cited by examiner

*Primary Examiner* — Zandra Smith
*Assistant Examiner* — Andre' C Stevenson
(74) *Attorney, Agent, or Firm* — Chip Law Group

(57) ABSTRACT

Disclosed herein is a presumably defective portion decision apparatus, including: an arithmetic operation section configured to divide a level difference included in level difference data which indicate a level difference distribution on the surface of a semiconductor device into two or more unit level differences in the depthwise direction of the level difference and determine, for each of the unit level differences obtained by the division, a relationship between the height of a contour line at a level difference position of an upper face and an area of an opening surrounded by the contour line to decide presence or absence of a presumably defective portion.

15 Claims, 26 Drawing Sheets

PRESUMABLY DEFECTIVE PORTION DECISION APPARATUS, PRESUMABLY DEFECTIVE PORTION DECISION METHOD, FABRICATION METHOD FOR SEMICONDUCTOR DEVICE AND PROGRAM

BACKGROUND

The present disclosure relates to a presumably defective portion decision apparatus, a presumably defective portion decision method, a fabrication method for a semiconductor device and a program in which, after a polishing step executed after a deposition step in a fabrication process for a semiconductor device, a result of the polishing is evaluated based on measurement, prediction or the like to carry out decision of a presumably defective portion.

In related art, as a technique adapted to achieve higher integration of a semiconductor integrated circuit, a smoothing process is carried out upon production of a semiconductor integrated circuit. As a smoothing processing technique, a chemical mechanical polishing method (hereinafter referred to as "CMP method") is available.

A concept of a polishing apparatus configured to carry out the CMP method is described below. FIG. 1 is a schematic view showing an example of a configuration of a polishing apparatus.

Referring to FIG. 1, a polishing apparatus 1 shown includes, as principal components thereof, a polishing plate 2, a substrate holding table 4 and an abrasive slurry supplying system 5.

The polishing plate 2 is supported on a polishing plate rotating shaft 2A and has a polishing pad 3 on a surface thereof.

The substrate holding table 4 is disposed above the polishing plate 2 and supported on a substrate holding table rotating shaft 4A. For example, where a substrate 7 on which a semiconductor integrated circuit is formed is polished, the substrate 7 is placed on the substrate holding table 4. The substrate holding table rotating shaft 4A is attached to a polishing pressure adjustment mechanism not shown configured to urge the substrate holding table 4 in a direction toward the polishing pad 3.

The polishing plate 2 is rotated while abrasive slurry 6 contained in an abrasive slurry container 5A of the abrasive slurry supplying system 5 and containing abrasive therein is supplied to the polishing pad 3 through an abrasive slurry introduction path 5B. At the same time, the polishing pressure of the substrate 7 against the polishing pad 3 is adjusted by the polishing pressure adjustment mechanism while the substrate 7 placed on the substrate holding table 4 is rotated. Consequently, a surface of the substrate 7 can be polished.

It is very significant, in order to solve a problem in fabrication of a semiconductor device at an early stage and reduce the fabrication cost, to predict, when a thin film is flattened after it is formed on a circuit pattern formed on the substrate 7, what thickness the thin film comes to have after flattened. Further, information of a sectional structure of a semiconductor device is used from a point of view of analysis of a characteristic of a semiconductor device, namely, timing convergence of a semiconductor integrated circuit, particularly from a point of view of resistance capacitance (RC) extraction. Therefore, by predicting a value of the thickness of a thin film formed on a circuit pattern to be flattened, it is possible to reduce time for timing convergence and feed back the value to a layout such as dummy fill.

As a method adapted to predict film formation and a polishing process, many simulation techniques have been proposed. For example, a method of detecting various kinds of defects caused by a circuit pattern in advance, a simulation technique in a case where the polishing pressure varies with respect to time passage and so forth have been proposed. Further, a method of carrying out level difference prediction after polishing to extract a critical portion of a film has been proposed.

Recently, a simulation technique taking not only polishing of a noticed film but also an underlying layer or layers into consideration for super refinement of a device, increase in strictness of a smoothing specification and so forth has been proposed (for example, refer to Japanese Patent Laid-Open No. 2008-10741).

Further, from a point of view of a layout, a technique automatically inserting, after a critical portion of a film is extracted by a simulation, a dummy in a unit of a mesh within a range within which it does not have influence on an electric characteristic of the circuit has been proposed (for example, refer to Japanese Patent No. 2010-140278).

SUMMARY

In the simulation techniques described above, a simulation is carried out using a value of a difference in level, namely, a depth. However, for example, a circuit pattern having a large opening at a distance between wiring lines or the like and another circuit pattern having a small opening are different in the polishing rate and hence in the final level difference level differences are equal, they are different in shape depending upon the circuit pattern. This indicates that, with the simulation techniques described above, the flatness differs even if values of level differences are equal or even depending upon the circuit pattern and indicates the possibility that the product yield may be deteriorated.

Accordingly, in regard to future polishing of devices, it is desired to carry out decision of a presumably defective portion taking not only a value of a difference in level but also the shape of the level difference into consideration.

According to an embodiment of the present disclosure, a level difference included in level difference data which indicate a level difference distribution on the surface of a semiconductor device is divided into two or more unit level differences in the depthwise direction of the level difference. Then, for each of the unit level differences obtained by the division, a relationship between the height of a contour line at a level difference position of an upper face and an area of an opening surrounded by the contour line is determined to decide presence or absence of a presumably defective portion.

More particularly, level difference data which indicate a level difference distribution on the surface of a semiconductor device are acquired first. Then, for each of level differences included in the acquired level difference data, more than one level difference position are set in the depthwise direction, and the level difference is divided into two or more unit level differences by the more than one level difference position. Then, for each of the unit level differences, the height of a contour line at a level difference position of an upper face from the deepest portion of the level difference and an area of an opening surrounded by the contour line are applied to a conditional expression. Then, presence or absence of a presumably defective portion is decided depending upon the conditional expression is satisfied.

In the present disclosure, for each of unit level differences obtained by dividing a level difference included in level difference data in the depthwise direction, a relationship between the height of a contour line at a level difference position of an upper face and an area of an opening surrounded by the contour line is determined to decide presence or absence of a presumably defective portion. Accordingly, a presumably defective portion decision process in which not only the value of a level difference, namely, a depth of the same, but also the shape of the level difference are taken into consideration is implemented.

With the present disclosure, decision of a presumably defective portion is carried out taking not only the value of a level difference but also the shape of the level difference into consideration. If appropriate measured are taken using a result of the decision, then quality improvement of a semiconductor device can be anticipated in that a semiconductor device of a high degree of flatness after polishing can be fabricated.

DETAILED DESCRIPTION OF THE PREFERRED EMBODIMENTS

In the following, preferred embodiments of the present disclosure are described with reference to the accompanying drawings.

It is to be noted that the description is given in the following order.

1. First Embodiment (example in which an arithmetic operation section includes a presumably defective portion decision block and carries out decision of a presumably defective portion from a relationship between the height of a unit level difference obtained by dividing a level difference and an opening area)

2. Second Embodiment (example in which an arithmetic operation section includes a level difference decision block)

3. Third Embodiment (example in which an arithmetic operation section includes a dummy insertion block)

4. Fourth Embodiment (example in which an arithmetic operation section includes a level difference decision block, a dummy insertion block and a level difference calculation block)

5. Fifth Embodiment (example in which an arithmetic operation section includes a level difference decision block, a dummy insertion block, a dummy deletion block, and a level difference calculation block)

6. Others (modifications)

1. First Embodiment

Outline of the Presumably Defective Portion Decision Algorithm

Each embodiment of the present disclosure provides a technique of deciding presence or absence of a presumably defective portion taking not only a value (depth) of a level difference (recessed portion) on a surface of a semiconductor device but also the shape of the level difference into consideration, and then quickly predicting and extracting a portion which is presumed to be defective after polishing.

In the following, a presumably defective portion decision algorithm used in a first embodiment of the present disclosure is described with reference to FIGS. 2 to 5.

Figure 2:
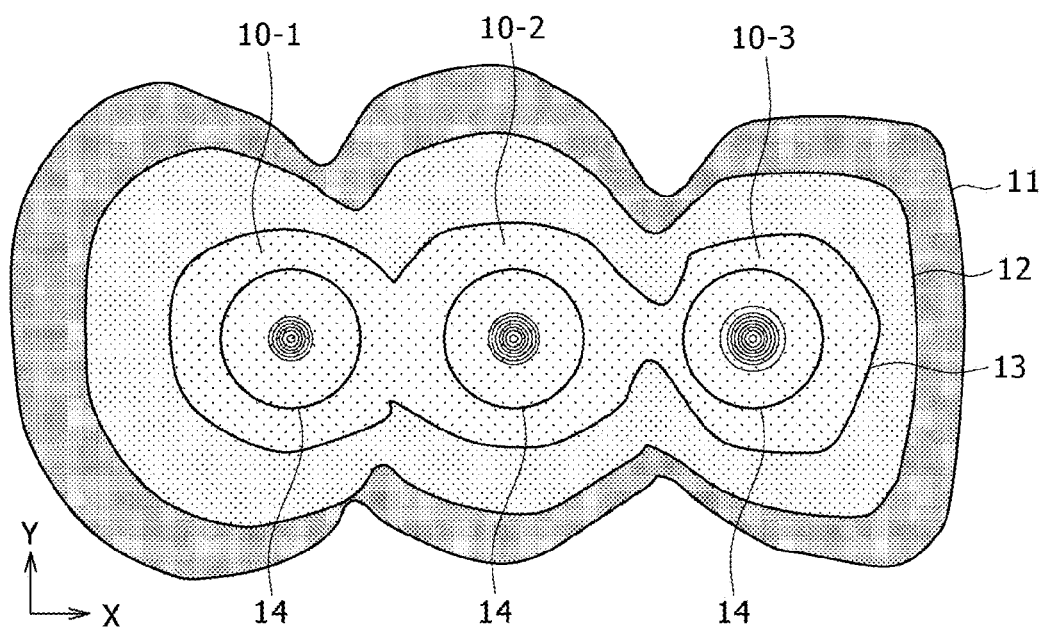
FIG. 2 is a schematic plan view showing an example of the surface of a semiconductor device which includes a difference in level or recessed portion.

FIG. 2 is an X-Y plan view showing an example of a surface of a semiconductor device which includes a difference in level such as a recess or a depression.

Referring to FIG. 2, in the example shown, recesses 10-1 to 10-3 of substantially circular patterns as viewed in plan are formed on a surface or an interface of a certain semiconductor device. Contour lines 11 to 14 are formed each by connecting level difference positions at the same height from a reference face having no pattern, namely, having no substantial difference in level and serving as a reference plane to each other by a line.

Figure 3:
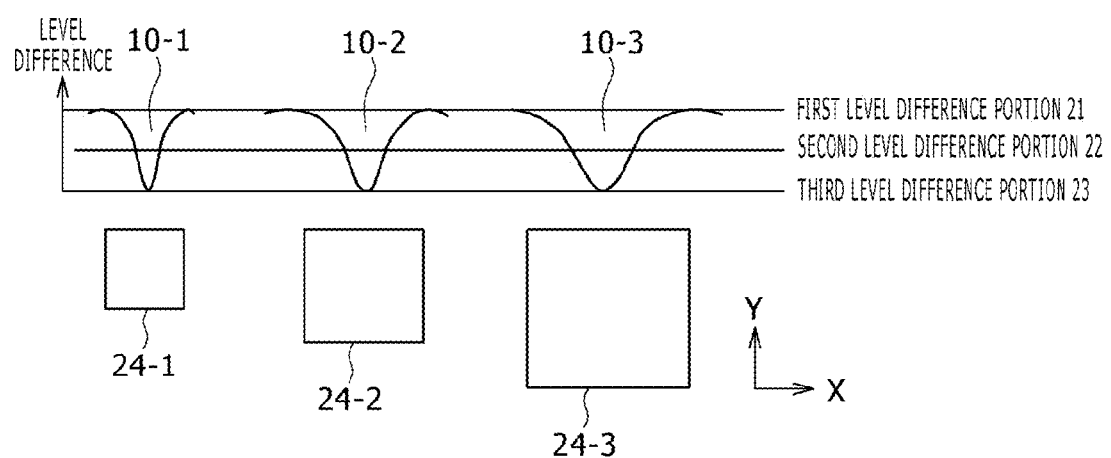
FIG. 3 is a schematic sectional view illustrating a shape of a level difference on the surface of a semiconductor device.

FIG. 3 is a schematic sectional view showing a shape of the recesses 10-1 to 10-3 on the semiconductor device surface.

Referring to FIGS. 2 and 3, although the recesses 10-1 to 10-3 have an equal depth, they are different in the ratio between the area (Feret's diameter on the X-Y plane) and the depth of openings 24-1 to 24-3, namely, in the aspect ratio. Although polishing amounts of the three recesses 10-1 to 10-3 are equal, the shape of the recess 10-3 has an opening greater than that of the recess 10-1. In the case of the shapes of the recesses 10-1 to 10-3 shown in FIG. 3, even if a defect does not appear, for example, with the recess 10-3, a defect may possibly appear with the recess 10-1.

Since this defect is not detected only by measurement of the depth of the recess, namely, the difference in level, a new checking algorithm is required. What is significant in this instance is the inclination of the recess with respect to a depthwise direction. In order to check the inclination, one or more level difference positions are provided intermediately from the position of a first level difference portion 21 which is a reference face and at which there is no substantial level difference to the position of a third level difference portion 23, which is the deepest portion and has the greatest difference in level with respect to the reference face.

In the present example, a second level difference portion 22 as an arbitrary level difference position is provided between the first level difference portion 21 which is the reference face and the third level difference portion 23 which is the deepest portion. A relationship between contour lines at the arbitrarily set level difference positions and the areas surrounded by the contour lines determines the acceptability of the semiconductor device. Accordingly, in order to decide whether or not the semiconductor device has a presumably defective portion, a following process may be carried out.

Figure 4:
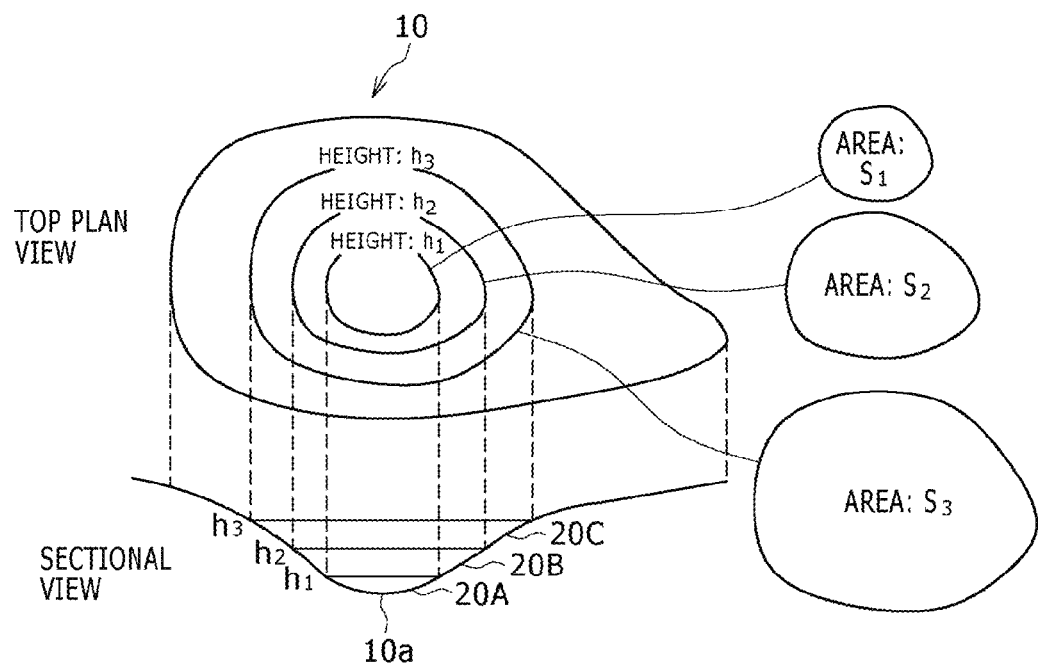
FIG. 4 is a diagrammatic view illustrating a presumably defective portion decision algorithm for a semiconductor device.

FIG. 4 illustrates the presumably defective portion decision algorithm for the semiconductor device in the present disclosure.

FIG. 4 particularly shows a top plan view and a sectional view in a case where a level difference of a certain recess 10 of the semiconductor device surface, namely, a distance from a deepest portion 10a to the reference face, is divided into three stages, namely, into three unit level differences, in the depthwise direction. Upper faces of the three unit level differences 20A, 20B and 20C have levels from the deepest portion 10a of the recess 10 which have a relationship of $h_1 < h_2 < h_3$ in depth. Further, the areas of regions surrounded by contour lines of the upper faces, namely, the level difference positions, of the unit level differences, namely, the opening areas, are represented by $S_1$, $S_2$ and $S_3$.

In the case of such level differences as described above, a conditional expression adapted to decide whether or not there is a presumably defective portion is given as follows:

$$D > (h_{i+1} - h_i) / \{\sqrt{(S_{i+1})} - \sqrt{(S_i)}\} \quad (1)$$

where D is a threshold value (hereinafter referred to as acceptability threshold value) adapted to decide whether or not the semiconductor device is acceptable and is determined through an experiment, and i is a natural number.

The right side of the expression (1) is calculated with regard to the contour lines at all of the set level difference positions using the height h and the area S. Then, the value of the right side of the expression (1) and the acceptability threshold value D are compared with each other to carry out extraction of a presumably defective portion. The height and the area of all of the contour lines of the set unit level differences are checked using the expression (1), and if the expression (1) is not satisfied by at least one of the unit level differences intermediately of the recess or level difference, then the recess is extracted as a defective portion and a countermeasure is taken.

In this manner, a level difference included in level difference data indicative of a level difference distribution of the surface of the semiconductor device is divided into two or more unit level differences, and for each of the divisional unit level differences, the expression (1) is used to determine a relationship between the height of the contour lines and the area of the openings at the heights to decide presence or absence of a presumably defective portion.

It is to be noted that the threshold value for division units, namely, a division number, of the level difference on the surface of a semiconductor device in the depthwise direction is more preferably determined based on the actually measured or predicted depth of the level difference. For example, even if the depths of level differences are equal, the possibility of defectiveness is higher with the level difference having a smaller opening in that the polishing residue is liable to appear with the level difference. Therefore, in this instance, the number of unit level differences, namely, the division number, may be increased.

Further, if the opening areas of level differences are equal, then the possibility of defectiveness is higher with the level difference having a greater depth, and therefore, the number of unit level differences, namely, the division number, may be increased.

Furthermore, in a case where the presumably defective portion decision algorithm has been carried out well for an arbitrary level difference, the threshold value for the division unit at this time may be used as an empirical value.

In a case where the process is complicated or at an initial stage of development at which the process is not stable, if the threshold value is set to a predetermined magnitude, then it is possible to extract a safe portion using the conditional expression and carry out a process at a succeeding stage for any other portion than the extracted portion.

Here, an example of a fabrication process of the semiconductor device to which the presumably defective portion decision algorithm which makes use of the conditional expression represented by the expression (1) above is applied is described.

Figure 5:
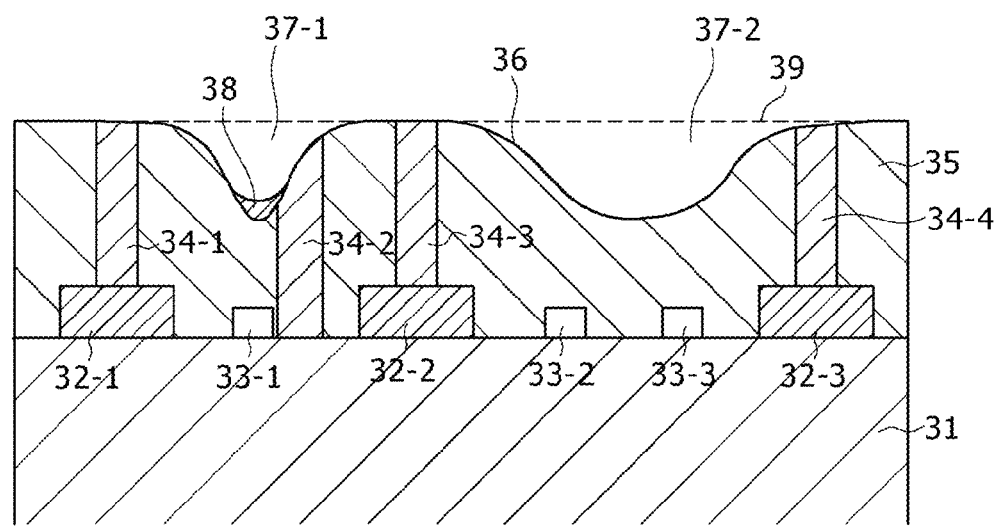
FIG. 5 is a partial sectional view of an example of a semiconductor device.

FIG. 5 is a partial sectional view of an example of the semiconductor device. The fabrication process which is used as an object of decision in the present embodiment is a process adapted to form contact vias (holes) in the proximity of a transistor gate terminal.

Referring to FIG. 5, in the fabrication process, gate electrodes 32-1 to 32-3, dummy elements 33-1 to 33-3 and contact vias 34-1 to 34-4 made of tungsten or the like are formed on a SiO$_2$ substrate 31 as an example. An oxide film 35 is formed on them from above. For example, a wiring line layer or transparent conductor layer not shown is formed in an upper layer of the oxide film 35.

When the upper layer of the contact vias 34-1 to 34-4 is polished, for example, recesses 37-1 and 37-2 are produced as level difference portions with respect to a reference face 39 on a working surface 36, which is a surface or an interface.

Although the recesses 37-1 and 37-2 have an equal depth, they are different in shape in the depthwise direction. Since the recess 37-1 has an inclination steeper than that of the recess 37-2, a polishing residue 38 is liable to appear. In a case where an upper layer from which the polishing residue 38 is originated is a metal layer, short-circuiting occurs with metal in the lower layer, resulting in failure in fabrication. In the embodiment described below, a layout (physical layout and mask layout), a process condition and so forth are changed in order to prevent such failure.

Figure 6:
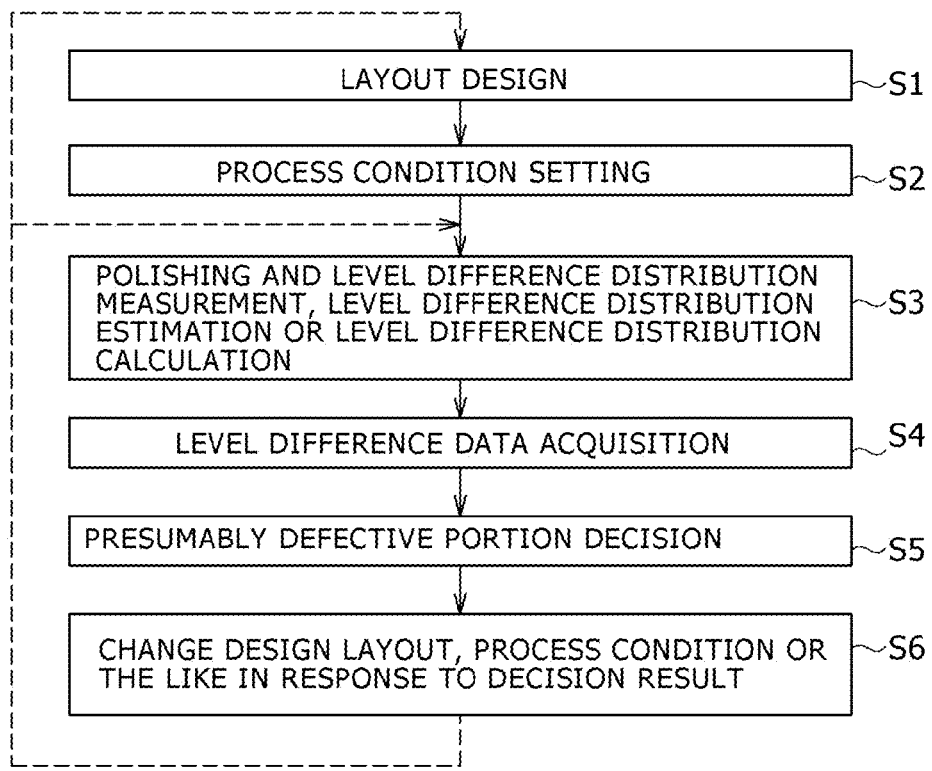
FIG. 6 is a flow chart illustrating a fabrication method for a semiconductor device which uses a presumably defective portion decision algorithm according to a first embodiment of the present disclosure.

FIG. 6 is a flow chart representing a process of extracting a presumably defective portion using the presumably defective portion decision algorithm described hereinabove and fabricating a semiconductor device of high quality.

Referring to FIG. 6, layout design of a semiconductor device is carried out first at step S1. Further, a processing condition is set in accordance with the designed layout at step S2.

Then, the layout is transferred to a wafer. In particular, a polishing apparatus-film formation apparatus 55 carries out a film formation process based on the layout. Then, the semiconductor device, namely, the wafer, to which the layout has been transferred, is subjected to a polishing process based on a process condition of the product by the polishing apparatus-film formation apparatus 55. Thereafter, level differences on the surface of the semiconductor device after the polishing are measured using a measuring instrument. As the measuring instrument, for example, an atomic force microscope (AFM) can be used. Or, a scanning electron microscope (SEM), a level difference measuring instrument and so forth can be used.

Or, estimation of a level difference distribution after polishing is carried out from a database in which relationships between a layout and a level difference are accumulated, or calculation or simulation of the level difference distribution is carried out from various conditions at step S3.

Acquisition and preparation of level difference data representative of the level difference distribution on the surface of the semiconductor device are carried out through one of the three processes described above at step S4.

Then, with regard to each of the level differences in the level difference distribution of the acquired level difference data of the semiconductor device surface, it is decided whether or not there is a presumably defective portion making use of the expression (1) at step S5.

In order to carry out verification, a division unit in the depthwise direction of the level differences of the semiconductor device surface is determined, and a contour line diagram (refer to FIG. 4) of the level difference for each unit level difference is produced based on the measurement result by the measuring instrument. Then, with regard to each of the unit level differences of all level differences, the height of the contour line at the level difference position on the upper face and the area of the opening at the height are substituted into the expression (1) to carry out calculation. In this manner, each level difference on the semiconductor device surface is divided into two or more unit level differences, and for each unit level difference, a relationship between the height of the contour line at the level difference position on the upper face and the area of the opening at the height is determined to decide presence or absence of a presumably defective portion.

If a result of the decision indicates that a portion at which the value of the right side of the expression (1) is equal to or higher than the acceptability threshold value, namely, a presumably defective portion, is detected, then change of the layout, process condition or the like at the pertaining place is examined at step S6. For example, if the number of presumably defective portions is great, then the process condition may be changed, but if the number of presumably defective portions is small, then the layout may be changed.

After the layout, process condition or the like is changed at step S6, the changed layout, process condition or the like is reflected on fabrication of semiconductor devices of a next lot such as the polishing step.

Or, with regard to a semiconductor device same as the semiconductor device of the object of verification, decision of presence or absence of a presumably defective portion may be carried out in the following manner. In particular, the polishing step is carried out again, and the level differences are measured actually or supposition or calculation of the level difference distribution is carried out to acquire level difference data. Then, decision of presence or absence of a presumably defective portion is carried out based on the acquired level difference data.

Figure 7:
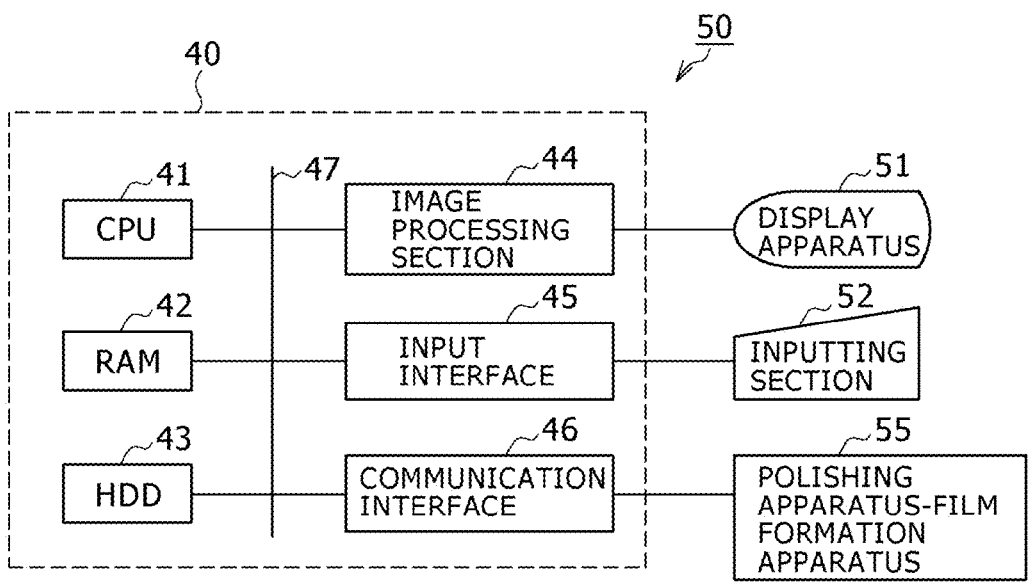
FIG. 7 is a block diagram showing an example of a configuration of a fabrication apparatus which executes the fabrication method for a semiconductor device of FIG. 6.

FIG. 7 is a block diagram showing an example of a schematic configuration of a fabrication apparatus for a semiconductor device which executes the fabrication method for a semiconductor device described hereinabove with reference to FIG. 6.

Referring to FIG. 7, a fabrication apparatus 50 for a semiconductor device shown includes a presumably defective portion decision apparatus 40 and the polishing apparatus-film formation apparatus 55 as principal components thereof.

The presumably defective portion decision apparatus 40 is configured, for example, applying a computer and executes the series of processes described hereinabove. The presumably defective portion decision apparatus 40 includes, for example, a central processing unit (CPU) 41, a random access memory (RAM) 42, and a hard disk drive (HDD) 43, which are connected to each other by a bus 47.

The CPU 41 is an arithmetic processing unit which carries out arithmetic operation and control in accordance with a predetermined program or based on an operation signal inputted thereto from an inputting section 52. The CPU 41 is an example of an arithmetic operation section.

The RAM 42 is a working memory which temporarily stores data and programs necessary for control by the CPU 41, a result of arithmetic operation and so forth.

The HDD 43 is an example of a nonvolatile storage section. The HDD 43 stores programs causing a presumably defective portion decision apparatus such as a program which describes the presumably defective portion decision algorithm to operate, information of a design layout, a process condition, a threshold value and so forth, a result of arithmetic operation and so forth.

To the bus 47, an image processing section 44, an input interface 45 and a communication interface 46, which is an example of a communication section, are connected further.

The image processing section 44 carries out production and processing of an image to be displayed on a display apparatus 51. The display apparatus 51 is configured applying a flat panel display (FPD) unit such as a liquid crystal display apparatus.

The input interface 45 receives an operation signal inputted thereto in response to operation contents of a user, for example, from the inputting section 52 and outputs the operation signal to the CPU 41 and so forth through the bus 47. The inputting section 52 is configured using an inputting means such as a pointing device and a keyboard.

The communication interface 46 carries out data communication with the polishing apparatus-film formation apparatus 55 in accordance with a predetermined communication protocol. For example, the communication interface 46 receives level difference data representative of the level difference distribution of the semiconductor device surface supplied thereto from the polishing apparatus-film formation apparatus 55 and outputs the level difference data to the CPU 41 and so forth through the bus 47.

Figure 1:
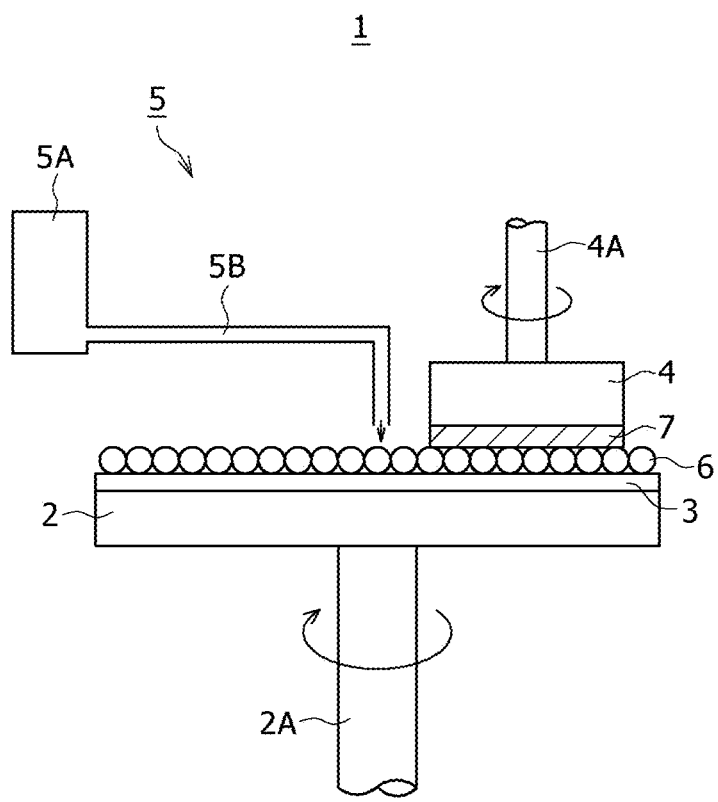
FIG. 1 is a schematic view showing an example of a configuration of a polishing apparatus.

The polishing apparatus-film formation apparatus 55 is a generic name of a polishing apparatus and a film formation apparatus, and, for example, the polishing apparatus 1 of FIG. 1 can be applied as the polishing apparatus.

In the presumably defective portion decision apparatus 40 configured in such a manner as described above, the CPU 41 loads a program stored in the HDD 43, a read only memory (ROM) not shown or the like into the RAM 42 through the bus 47 and executes the program to carry out a series of steps of the presumably defective portion decision process.

In the following, an example of a configuration and an example of operation of the presumably defective portion decision apparatus provided in the fabrication apparatus for a semiconductor device according to the first embodiment described hereinabove are described particularly in connection with first to third examples.

1-1. First Example

Case in which Level Difference Data are Acquired by Actual Measurement

In the first example of the first embodiment of the present disclosure, level difference data representative of the level difference distribution of the semiconductor device surface are acquired from actual measurement data after polishing.

Figure 8:
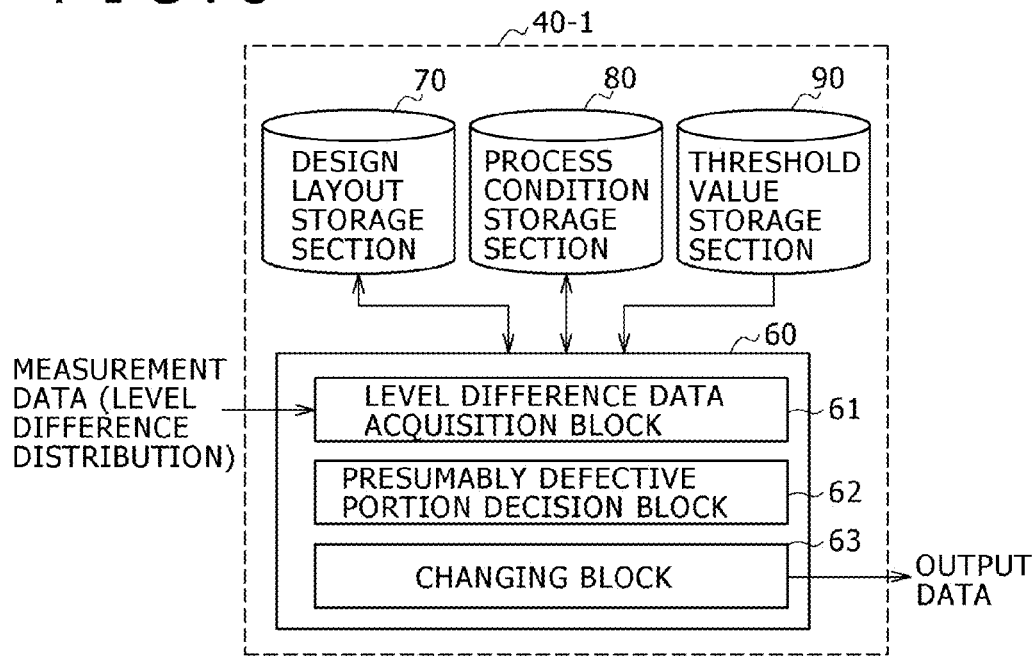
FIG. 8 is a block diagram showing an example of a configuration of a presumably defective portion decision apparatus provided in a fabrication apparatus for a semiconductor device according to a first example of the first embodiment of the present disclosure.

FIG. 8 is a block diagram showing an example of a configuration of the presumably defective portion decision apparatus provided in the fabrication apparatus 50 for a semiconductor device according to the first example of the first embodiment.

Referring to FIG. 8, a presumably defective portion decision apparatus 40-1 shown has an example of particular functional blocks of the presumably defective portion decision apparatus 40 shown in FIG. 7.

The presumably defective portion decision apparatus 40-1 includes an arithmetic operation section 60, a design layout storage section 70, a process condition storage section 80 and a threshold value storage section 90.

The design layout storage section 70 stores therein design data, for example, of a stream type (design for manufacturing (GDS)) or a common intermediate format (CIF) type, adapted to describe a mask layout for the semiconductor device.

The process condition storage section 80 stores a condition applied when the surface of the semiconductor device is polished, for example, by a polishing apparatus.

The threshold value storage section 90 stores the acceptability threshold value of the conditional expression represented by the expression (1) or a level difference threshold value hereinafter described.

The design layout storage section 70, process condition storage section 80 and threshold value storage section 90 can be configured, for example, using the HDD 43 shown in FIG. 7.

The arithmetic operation section 60 includes a level difference data acquisition block 61, a presumably defective portion decision block 62 and a changing block 63. The arithmetic operation section 60 can be configured using the CPU 41 shown in FIG. 7.

The level difference data acquisition block 61 acquires data representative of the level difference distribution of the semiconductor device surface, namely, level difference data. In the present first example, level differences on the surface (wafer) of the semiconductor device polished, for example, by the polishing apparatus-film formation apparatus 55 are measured by an AFM. The measurement data are acquired as level difference data through the communication interface 46 by the level difference data acquisition block 61.

The presumably defective portion decision block 62 decides whether or not the level differences in the level difference distribution of the level difference data of the semiconductor device surface acquired by the level difference data acquisition block 61 are presumably defective portions making use of the conditional expression represented by the expression (1).

If, as a result of the decision by the presumably defective portion decision block 62, a presumably defective portion exits, then the changing block 63 changes the layout, process condition or the like automatically or by manual operation. Then, the changing block 63 outputs the layout, process condition or the like after the change to the polishing apparatus-film formation apparatus 55 and updates the layout of the design layout storage section 70 or the process condition of the process condition storage section 80.

Figure 9:
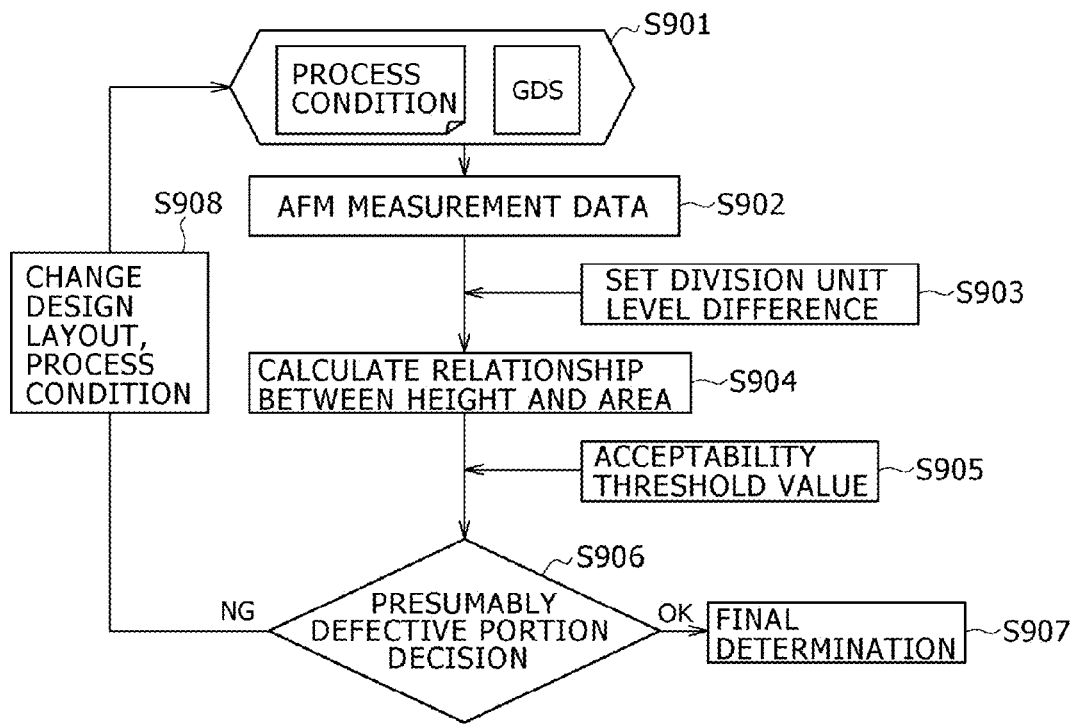
FIG. 9 is a flow chart illustrating a presumably defective portion decision process by the presumably defective portion decision apparatus of FIG. 8.

FIG. 9 is a flow chart illustrating the presumably defective portion decision process by the presumably defective portion decision apparatus 40-1 according to the first example of the first embodiment.

The present flow chart represents a particular example of a fabrication method for a semiconductor device which uses the presumably defective portion decision algorithm of FIG. 6.

The arithmetic operation section 60 of the presumably defective portion decision apparatus 40-1 stores a GDS, namely, a layout, into the design layout storage section 70 and stores a process condition into the process condition storage section 80 at step S901.

Level differences of the semiconductor device surface after the semiconductor device (wafer), to which a designed layout has been transferred, is subjected to a polishing process based on the process condition for the product are measured, for example, by an AFM. Then, level difference data corresponding to the layout are acquired by the level difference data acquisition block 61 at step S902.

The presumably defective portion decision block 62 determines division units in the depthwise direction of each level difference of the semiconductor device surface and carries out setting of the unit level differences at step S903. In the present example, the unit level differences are set as an example to 20 nm.

The presumably defective portion decision block 62 produces a contour line diagram (refer to FIG. 4) of the level difference for each unit level difference based on the level difference data acquired from the AFM. Then, the presumably defective portion decision block 62 substitutes, for each unit level difference of all level differences, the height of the contour line at the level difference position of the upper face and the area of the opening at the height into the expression (1) to calculate the right side of the expression (1). In this manner, each level difference of the semiconductor device surface is divided into two or more unit level differences, and for each unit level difference, a relationship between the height of the contour line at the level difference position of the upper face and the area of the opening at the height is determined at step S904.

The presumably defective portion decision block 62 reads out an acceptability threshold value determined in advance from the threshold value storage section 90 at step S905. Then, the presumably defective portion decision block 62 carries out comparison between the value of the right side of the expression (1) and the acceptability threshold value to decide presence or absence of a presumably defective portion at step S906. In the present embodiment, the acceptability threshold value is set to $5.0 \times e^{-6}$ as an example.

If the value of the right side of the expression (1) is lower than the acceptability threshold value in the decision process at step S906, then the changing block 63 does not carry out change of the layout and the process condition but maintains the layout and the process condition at step S907. For example, the maintained layout and process condition are applied also to the polishing step for semiconductor devices of the next lot.

If it is decided by the decision process at step S906 that there is a portion at which the value of the right side of the expression (1) is equal to or higher than the acceptability threshold value, or in other words, there is a presumably defective portion, then the changing block 63 changes, automatically or by manual operation of the inputting section 52, at least one of the layout and the process condition of the pertaining portion in accordance with a rule determined in advance so that the expression (1) may be satisfied at step S908. For example, the changing block 63 outputs, for example, the layout or process condition after the change to the polishing apparatus-film formation apparatus 55 and updates the layout in the design layout storage section 70 and the process condition in the process condition storage section 80. Then, the changing block 63 applies the updated layout and process condition to the polishing step for semiconductor devices of the next lot.

For example, since a large number of layout patterns are available, if the number of presumably defective portions is very great, frequently the process condition is not in a well-adjusted state. In such a case, it is necessary to carry out process condition setting again. In a case where several presumably defective portions are available and appear in a concentrated manner at portions at which the opening is great, such layout correction as to reduce the size of the openings is carried out.

In a change of the process condition, for example, polishing time adjustment such as decreasing over polishing time, polishing pressure adjustment such as decreasing polishing pressure, rotational speed adjustment such as increasing the rotational speed of a polishing platen, slurry adjustment such as increasing the slurry additive or changing a mixing ratio, change of the slurry type, flow rate adjustment of the slurry or the like is carried out.

Figure 10:
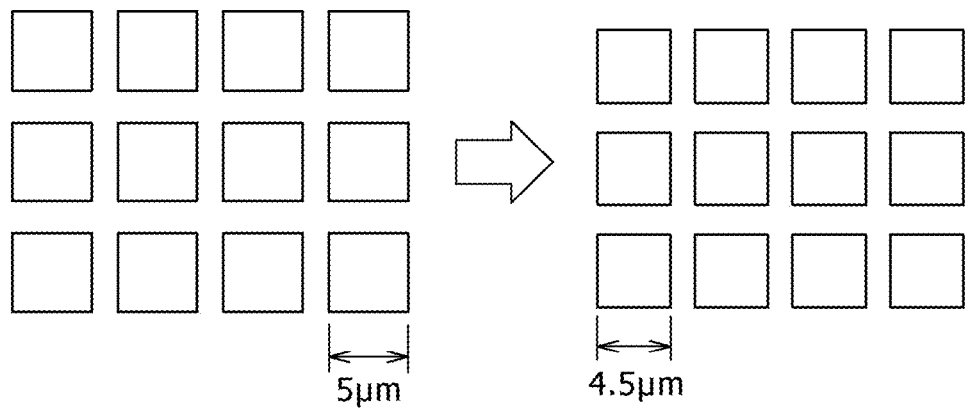
FIG. 10 is a diagrammatic view illustrating an example of a change of a design layout.

FIG. 10 is a schematic view illustrating an example in which the layout is changed.

More particularly, FIG. 10 illustrates an example in which local layout change for narrowing the opening is carried out for patterns which include several portions at which the value of the right side of the expression (1) is equal to or higher than $5.0 \times e^{-6}$ and which are located in a concentrated manner at a portion at which the opening is great.

In particular, a change in dimension by 0.5 µm, namely, a bias process, was carried out uniformly for the pertaining patterns to make the opening of the patterns smaller from 5 µm to 4.5 µm. Then, when a wafer was prepared again after the change of the layout and level difference measurement was carried out by an AFM, the presumably defective portions disappeared. The bias amount described above was set by back calculating in such a manner that the acceptability threshold value $5.0 \times e^{-6}$ is satisfied.

With the first example of the first embodiment described above, by extracting a presumably defective portion based on the conditional expression represented by the expression (1) and carrying out a suitable treatment, a semiconductor device having a high degree of flatness after polishing can be fabricated. Then, not only a single layer of the semiconductor device but also a result of lamination, namely, a product, can keep a high degree of flatness.

It is to be noted that, in the case where measurement data of a level difference of the surface of the semiconductor device used in the present example are data of a test pattern result or data acquired already, a problem of flatness can be solved before an actual fabrication process is carried out.

The acceptability threshold value of the expression (1), the bias amount and the unit of level differences used in the first example of the first embodiment are not limited to the values specified in the present example but can be set variously in response to the process condition or the layout. Further, the order of the processes adapted to implement the flatness is not limited to that described in the description of the present example.

The particular examples and the modifications in the first example of the first embodiment can naturally be applied also to the second example and the third example of the first embodiment hereinafter described.

1-2. Second Example

Case in which Level Difference Data are Acquired by Supposition

The second example of the first embodiment of the present disclosure prepares level difference data, namely, supposes level differences, using a database of a relationship between layouts and level differences prepared in advance in place of preparation of level difference data actually measured by an AFM.

Figure 11:
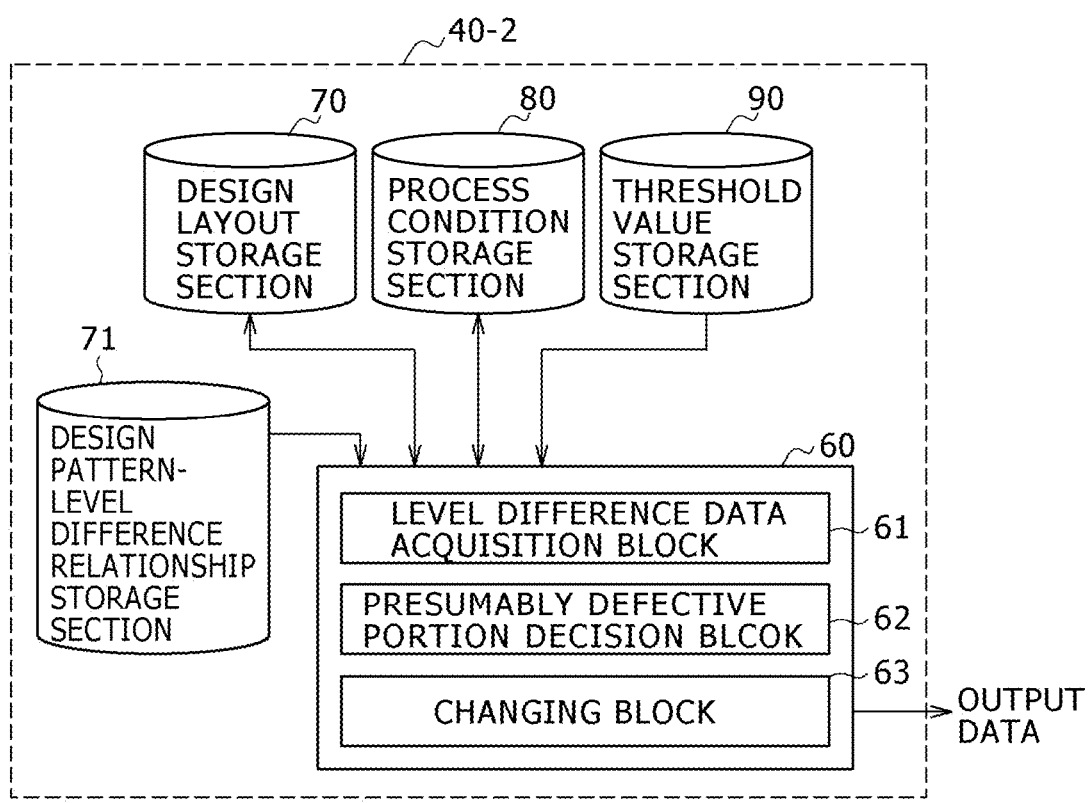
FIG. 11 is a block diagram showing an example of a configuration of a presumably defective portion decision apparatus provided in a fabrication apparatus for a semiconductor device according to a second example of the first embodiment of the present disclosure.

FIG. 11 is a block diagram showing an example of a configuration of a presumably defective portion decision apparatus provided in the fabrication apparatus 50 for a semiconductor device according to the second example of the first embodiment.

Referring to FIG. 11, a presumably defective portion decision apparatus 40-2 shown is an example having particular functional blocks of the presumably defective portion decision apparatus 40 shown in FIG. 7. The presumably defective portion decision apparatus 40-2 includes a design pattern-level difference relationship storage section 71 in addition to the components of the presumably defective portion decision apparatus 40-1 of FIG. 8. In the following description given with reference to FIG. 11, the difference from FIG. 8 is described principally while description of those components which have like functions or configurations is omitted herein to avoid redundancy.

The presumably defective portion decision apparatus 40-2 includes the arithmetic operation section 60, the design layout storage section 70, the design pattern-level difference relationship storage section 71, the process condition storage section 80 and the threshold value storage section 90.

The design pattern-level difference relationship storage section 71 stores therein a database including position coordinates (X, Y) of design patterns for a layout and values (Z) of level differences or depths from the reference face at the coordinates. The design pattern-level difference relationship storage section 71 can be configured using, for example, the HDD 43 shown in FIG. 7.

The level difference data acquisition block 61 of the arithmetic operation section 60 acquires level difference data representative of the level difference distribution of the surface of the semiconductor device corresponding to the pertaining layout from the database stored in the design pattern-level difference relationship storage section 71.

Figure 12:
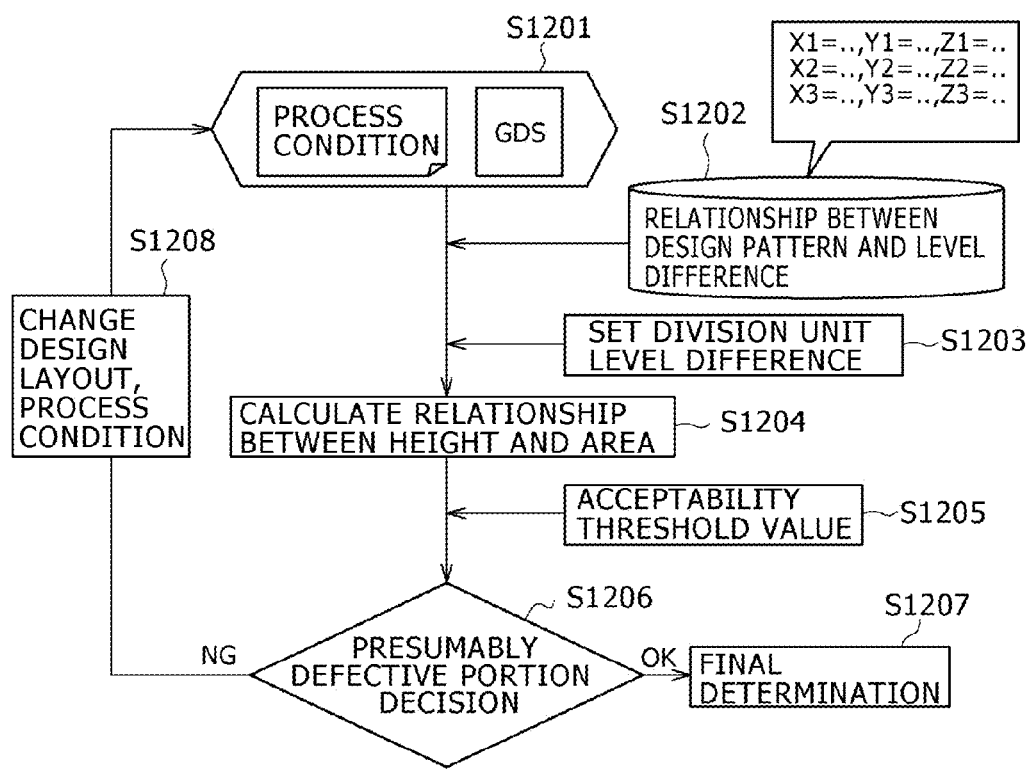
FIG. 12 is a flow chart illustrating a presumably defective portion decision process by the presumably defective portion decision apparatus shown in FIG. 11.

FIG. 12 is a flow chart illustrating a presumably defective portion decision process by the presumably defective portion decision apparatus 40-2 according to the second example of the first embodiment. The present flow chart represents a particular example of a fabrication method for a semiconductor device which uses the presumably defective portion decision algorithm of FIG. 6.

Processes at steps S1201 to S1208 in FIG. 12 are similar to those at steps S901 to S908 in FIG. 9, respectively, except a process at step S1202.

The process at step S1202 is described. After the process at step S1201 ends, the level difference data acquisition block 61 of the arithmetic operation section 60 reads out position coordinates (X, Y) of a design pattern of the pertaining layout and a value (Z) of a level difference or depth from the reference face at the coordinates from the database of the design pattern-level difference relationship storage section 71. Consequently, the level difference data acquisition block 61 acquires level difference data representative of the level difference distribution of the semiconductor device surface corresponding to the pertaining layout at step S1202.

After the process at step S1203 ends, the presumably defective portion decision block 62 prepares a contour line diagram (refer to FIG. 4) of a level difference for each unit level difference based on the level difference data acquired from the design pattern-level difference relationship storage section 71. Then, the presumably defective portion decision block 62 substitutes, for each unit level difference of all level differences, the height of the contour line at the level difference position of the upper face and the area of the opening at the height into the expression (1) to calculate the right side of the expression (1) at step S1204.

At steps S1205 to S1208, processes similar to those at steps S905 to S908 described hereinabove are carried out, respectively.

With the second example of the first embodiment described above, following working effects are exhibited in addition to the working effects exhibited by the first example of the first embodiment.

In the present example, level difference data are acquired by referring to the database in which relationships between a design pattern and a level difference of layouts are stored such as the design pattern-level difference relationship storage section 71. Therefore, the time for actually measuring the level difference of the semiconductor device surface is reduced, and consequently, higher speed processing can be anticipated.

Further, in the present example, the database in which level difference data acquired already are stored is used, and consequently, the problem of flatness can be solved before an actual fabrication process.

1-3. Third Example

Case in which Level Difference Data are Acquired by Calculation

In the third example of the first embodiment of the present disclosure, a level difference distribution calculated from a layout and a process model is used to prepare level difference data in place of preparation of level difference data actually measured by an AFM.

Figure 13:
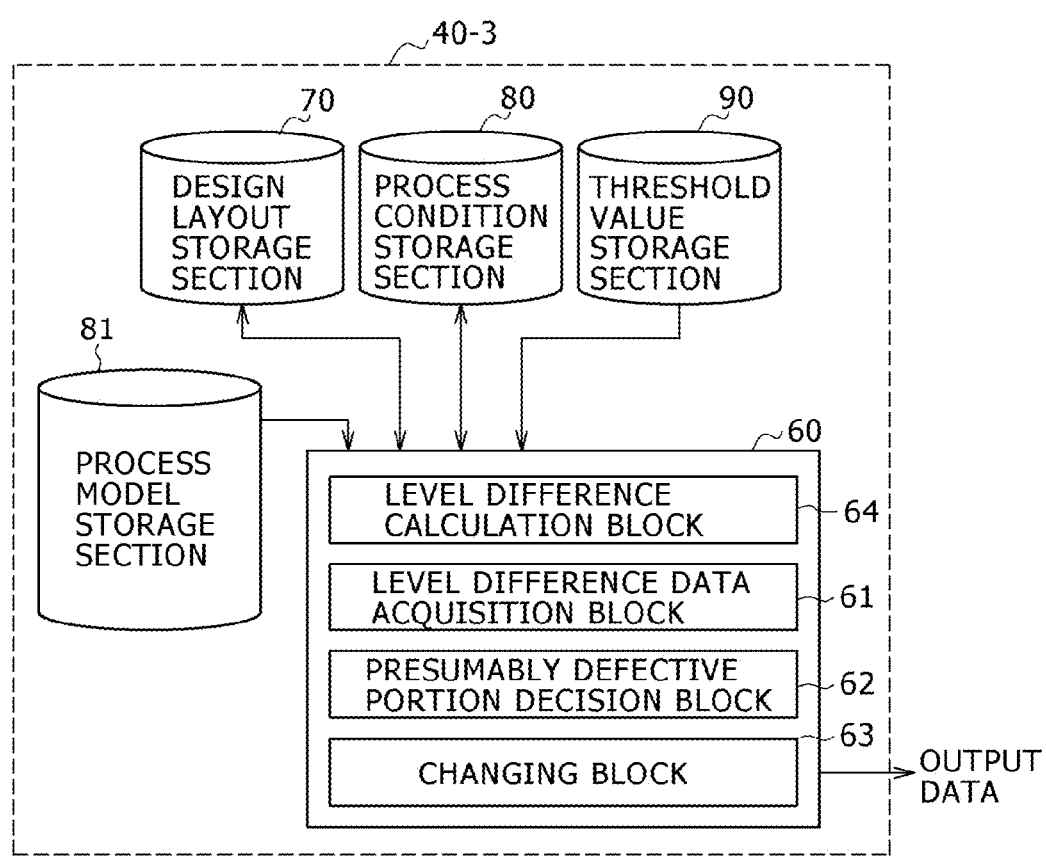
FIG. 13 is a block diagram showing an example of a configuration of a presumably defective portion decision apparatus provided in a fabrication apparatus for a semiconductor device according to a third example of the first embodiment of the present disclosure.

FIG. 13 is a block diagram showing an example of a configuration of a presumably defective portion decision apparatus provided in the fabrication apparatus 50 for a semiconductor device according to the third example of the first embodiment.

Referring to FIG. 13, a presumably defective portion decision apparatus 40-3 shown has an example of detailed functional blocks of the presumably defective portion decision apparatus 40 shown in FIG. 7. The presumably defective portion decision apparatus 40-3 includes a process model storage section 81 and a level difference calculation block 64 in addition to the components of the presumably defective portion decision apparatus 40-1 of FIG. 8. In the following description given with reference to FIG. 13, the difference from FIG. 8 is described principally while description of those components which have like functions or configurations is omitted herein to avoid redundancy.

The presumably defective portion decision apparatus 40-3 includes the arithmetic operation section 60, the design layout storage section 70, the process condition storage section 80, the process model storage section 81 and the threshold value storage section 90.

The process model storage section 81 stores therein a plurality of pieces of information, namely, more than one process model obtained by modeling a process condition at a polishing step of, for example, a CMP method. One process model includes information of, for example, the speed of rotation of the polishing platen, the polishing pressure, polishing time and so forth. The process model storage section 81 can be configured, for example, using the HDD 43 shown in FIG. 7.

The arithmetic operation section 60 includes the level difference data acquisition block 61, the presumably defective portion decision block 62, the changing block 63 and the level difference calculation block 64.

The level difference calculation block 64 uses the layouts in the design layout storage section 70 and the process models in the process model storage section 81 to calculate the level difference distribution of the semiconductor device surface after polishing, namely, to carry out a simulation.

The level difference data acquisition block 61 acquires, from a result of the calculation of the level difference distribution carried out for the pertaining layout by the level difference calculation block 64, level difference data representative of the level difference distribution of the semiconductor device surface corresponding to the pertaining layout.

Figure 14:
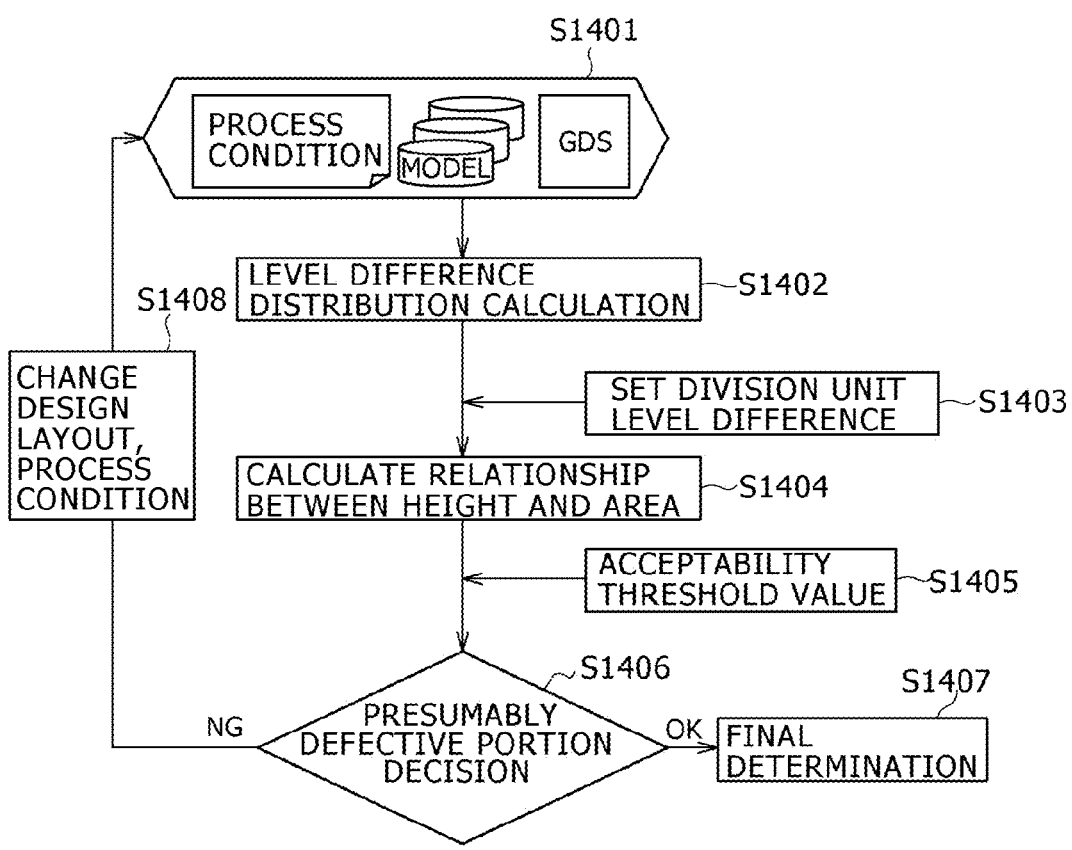
FIG. 14 is a flow chart illustrating a presumably defective portion decision process by a presumably defective portion decision apparatus according to a third example of the first embodiment of the present disclosure.

FIG. 14 is a flow chart illustrating a presumably defective portion decision process by the presumably defective portion decision apparatus 40-3 according to the third example of the first embodiment. The present flow chart indicates a particular example of the fabrication method for a semiconductor device in which the presumably defective portion decision algorithm of FIG. 6 is used.

Processes at steps S1401 to S1408 in FIG. 14 are similar to those at steps S901 to S908 in FIG. 9, respectively, except processes at steps S1401 and S1402.

First, the presumably defective portion decision apparatus 40-3 stores a GDS or layout into the design layout storage section 70, stores a process condition into the process condition storage section 80 and further stores more than one process model into the process model storage section 81 at step S1401.

The level difference data acquisition block 61 acquires, from a result of calculation of the level difference distribution carried out by the level difference calculation block 64 using the layouts in the design layout storage section 70 and the process models in the process model storage section 81, level difference data representative of the level difference distribution of the semiconductor device surface corresponding to the pertaining layout at step S1402.

After the process at step S1403 ends, the presumably defective portion decision block 62 prepares a contour line diagram (refer to FIG. 4) of level differences for each unit level difference based on level difference data calculated by the level difference calculation block 64. Then, the presumably defective portion decision block 62 substitutes, for each unit level difference of all level differences, the height of the contour line at the level difference position of the upper face and the area of the opening at the height into the expression (1) to carry out calculation of the expression (1) at step S1404.

At steps S1405 to S1408, processes similar to those at steps S905 to S908 are carried out, respectively.

It is to be noted that, at step S1407, if the value of the right side of the expression (1) is lower than the acceptability threshold value in the decision process at step S1406, the changing block 63 reflects the process model at present on the process condition to finally determine the layout and the process condition. Then, the finally determined layout and process condition are applied to an actual polishing step for a semiconductor device.

At step S1408, a following process may be carried out in addition to the process at step S908.

For example, in a case where a presumably defective portion is detected, contents of the process model are changed by the changing block 63, or a different process model is read out from the process model storage section 81 and the level difference distribution calculation with regard to the layout is carried out again using the different process model. Then, the layout and the process condition are finally determined in response to a result of the presumably defective portion decision carried out for the second time. For example, if the result of the second time presumably defective portion decision is favorable, then the process model used for the second time decision is reflected on the process condition and the layout and the process condition are finally determined. Then, the finally determined layout or process condition is outputted to the polishing apparatus-film formation apparatus 55, and the layout in the design layout storage section 70 and the process condition in the process condition storage section 80 are updated and applied to the polishing step for semiconductor devices of a next lot.

With the third example of the first embodiment described above, following working effects are exhibited in addition to the working effects exhibited by the first example of the first embodiment.

In the present example, since the level difference distribution of the semiconductor device surface is calculated from a layout and a process model to obtain level difference data, the time for actually measuring the level difference of the semiconductor device surface is reduced. Consequently, higher speed processing can be anticipated.

Further, in the present example, by carrying out model-based highly accurate calculation or simulation, level difference data with sufficient accuracy can be obtained.

Furthermore, in the present example, by carrying out model-based calculation to acquire level difference data, the problem of flatness can be solved before an actual fabrication process.

2. Second Embodiment

In following first to third examples of a second embodiment, a filtering function, namely, a level difference decision block, for the depth of a level difference is provided in the presumably defective portion decision apparatus in the first to third examples of the first embodiment.

2-1. First Example

Case in which Level Difference Data are Acquired by Actual Measurement

Figure 15:
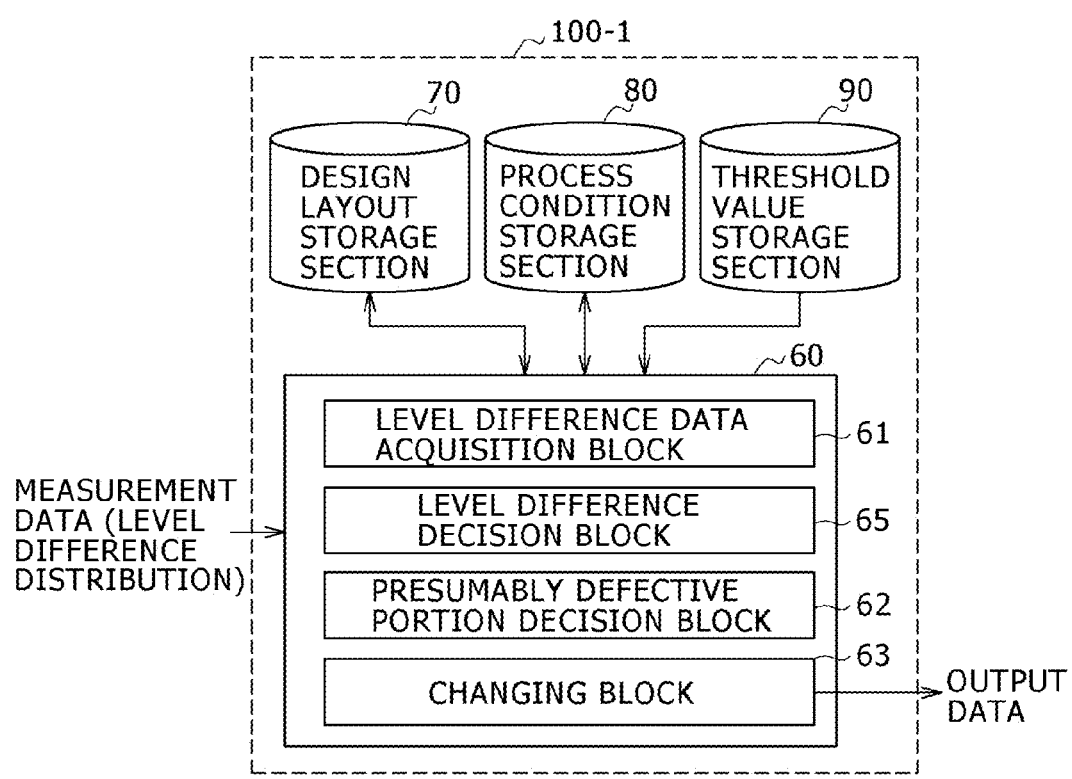
FIG. 15 is a block diagram showing an example of a configuration of a presumably defective portion decision apparatus provided in a fabrication apparatus for a semiconductor device according to a first example of a second embodiment of the present disclosure.

FIG. 15 is a block diagram showing an example of a configuration of a presumably defective portion decision apparatus provided in the fabrication apparatus 50 for a semiconductor device according to the first example of the second embodiment.

Referring to FIG. 15, a presumably defective portion decision apparatus 100-1 shown includes a level difference decision block 65 in the arithmetic operation section 60 in addition to the components of the presumably defective portion decision apparatus 40-1 described hereinabove with reference to FIG. 8. In the following description given with reference to FIG. 15, the difference from FIG. 8 is described principally while description of those components which have like functions or configurations is omitted herein to avoid redundancy.

The presumably defective portion decision apparatus 100-1 includes the arithmetic operation section 60, the design layout storage section 70, the process condition storage section 80 and the threshold value storage section 90.

The level difference decision block 65 of the arithmetic operation section 60 compares a threshold value for a level difference determined in advance (such threshold value is hereinafter referred to as level difference threshold value) and the depth from the reference face to the deepest portion of level differences of level difference data acquired by the level difference data acquisition block 61 with each other to decide whether or not there is a level difference greater or deeper than the level difference threshold value. The level difference threshold value has an appropriate value determined in advance from a relationship between a design pattern and a level difference in a layout and stored in the threshold value storage section 90. For example, in the present embodiment, the level difference threshold value is 100 nm.

Figure 16:
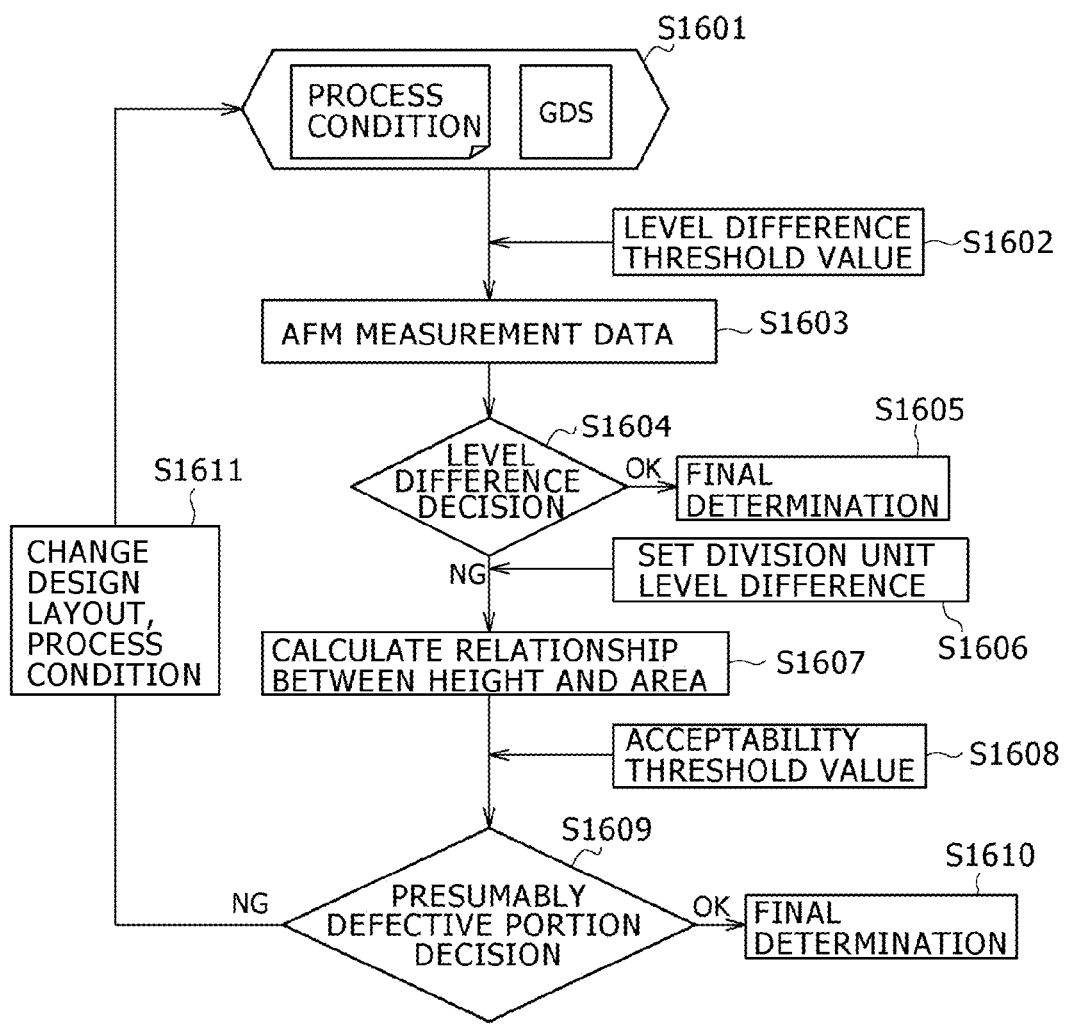
FIG. 16 is a flow chart illustrating a presumably defective portion decision process by the presumably defective portion decision apparatus of FIG. 15.

FIG. 16 is a flow chart illustrating a presumably defective portion decision process by the presumably defective portion decision apparatus 100-1 according to the first example of the second embodiment.

This flow chart is different from the flow chart of FIG. 9 in the first example of the first embodiment in that it additionally includes steps S1602, S1604 and S1605.

Since steps S1601, S1603 and S1606 to S1611 correspond to the steps S901 to S908 of FIG. 9, respectively, detailed description of them is omitted herein to avoid redundancy.

Referring to FIG. 16, after the process at step S1601 ends, the level difference decision block 65 of the arithmetic operation section 60 reads out the level difference threshold value from the threshold value storage section 90 at step S1602. Then, the level difference decision block 65 compares level differences included in level difference data obtained by actual measurement at step S1603 with the level difference threshold value to decide whether or not the level difference data include a level difference greater than the level difference threshold value at step S1604.

If the level difference data do not include a level difference greater than the level difference threshold value (OK at step S1604), then the arithmetic operation section 60 does not carry out change of the layout and the process condition but maintains the layout and the process condition at step S1605 similarly as at step S907.

If the level difference data include a level difference greater than the level difference threshold value (NG at step S1604), then the level difference decision block 65 extracts those level differences which are greater than the level difference threshold value. Then, the presumably defective portion decision block 62 and the changing block 63 carry out the processes at succeeding steps S1606 to S1611 with regard to the extracted level differences.

Figure 17:
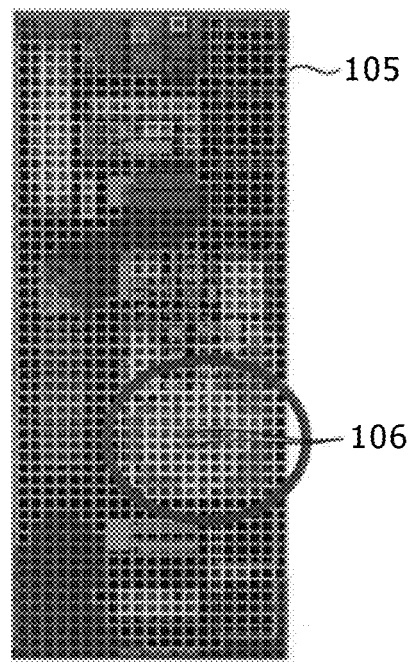
FIG. 17 is a schematic plan view showing an example of differences in level extracted by a level difference decision in which a level difference threshold value is used.

FIG. 17 is a top plan view showing an example of level differences extracted by the level difference decision using the level difference threshold value.

Referring to FIG. 17, a level difference 106 in a layout of a substrate 105, on which a semiconductor integrated circuit is formed, extracted by carrying out the filtering process is represented by a surrounding circle.

Although the level difference 106 shown in FIG. 17 is a mere example, since the number of portions which exceed the level difference threshold value is small, a load applied to the later presumably defective portion decision process can be reduced significantly.

With the first example of the second embodiment described above, following working effects are exhibited in addition to the working effects exhibited by the first example of the first embodiment.

In the present example, the decision process at step S1604 based on the magnitude or depth of a level difference is carried out and a presumably defective portion decision process is carried out applying the conditional expression only to comparatively great level differences in the level difference data. Therefore, the calculation amount can be suppressed and the processing tact can be reduced significantly.

It is to be noted that the particular examples and the modifications in the first example of the second embodiment can naturally be applied also to the second example and the third example of the second embodiment hereinafter described.

2-2. Second Example

Case in which Level Difference Data are Acquired by Supposition

Figure 18:
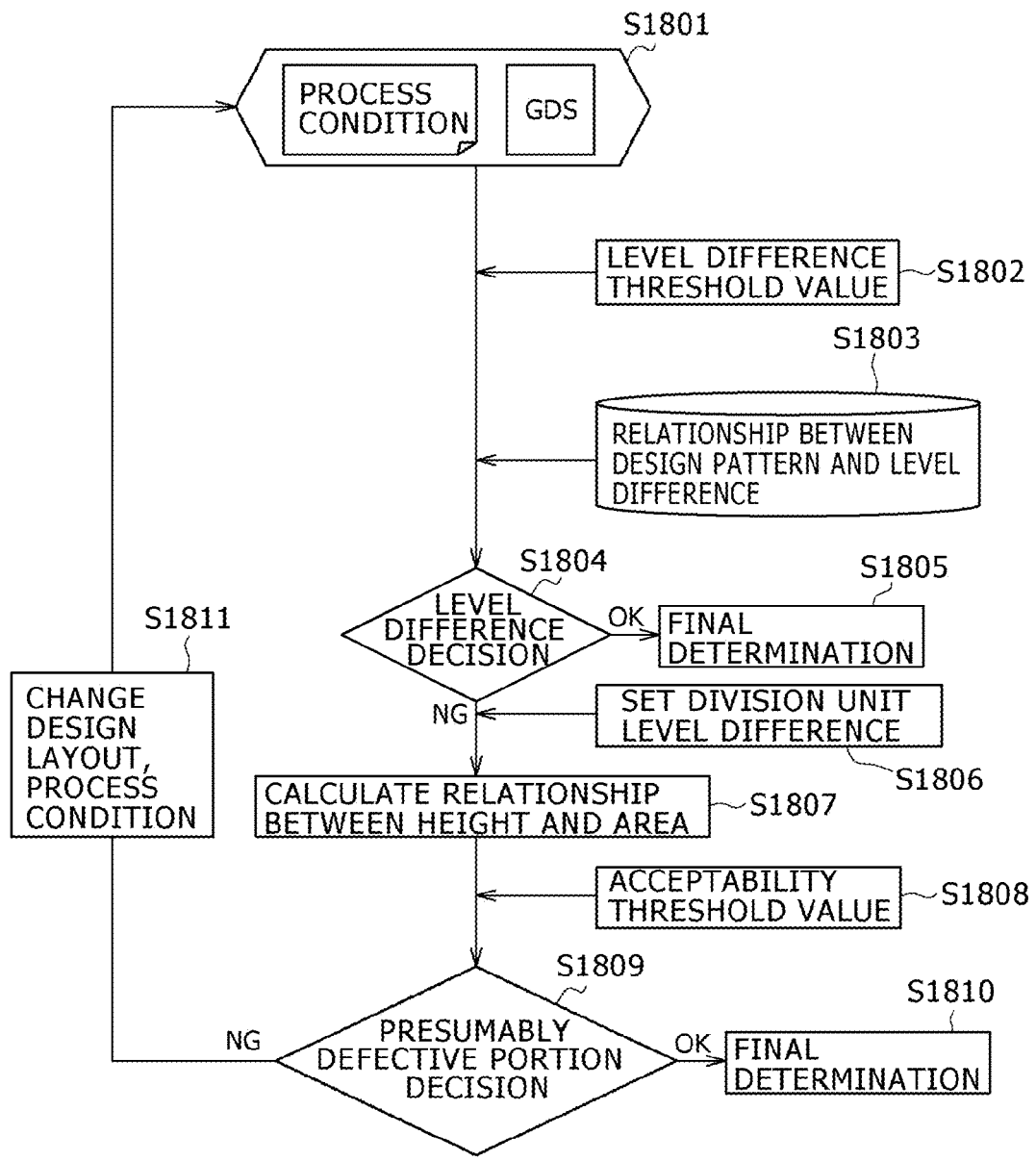
FIG. 18 is a flow chart illustrating a presumably defective portion decision process by a presumably defective portion decision apparatus according to a second example of the second embodiment of the present disclosure.

FIG. 18 is a flow chart illustrating a presumably defective portion decision process by a presumably defective portion decision apparatus according to the second example of the second embodiment.

The flow chart of FIG. 18 is different from the flow chart of FIG. 12 in the second example of the first embodiment in that it additionally includes steps S1802, S1804 and S1805.

Steps S1801, S1803 and S1806 to S1811 correspond to the steps S1201 to S1208 of FIG. 12, respectively, and therefore, detailed description of them is omitted herein to avoid redundancy.

It is to be noted that the presumably defective portion decision apparatus which executes the processing of the flow chart of FIG. 18 additionally includes the level difference decision block 65 to the arithmetic operation section 60 of the presumably defective portion decision apparatus 40-2 in the second example of the first embodiment shown in FIG. 11.

Referring to FIG. 18, after the process at step S1801 ends, the level difference decision block 65 of the arithmetic operation section 60 reads out the level difference threshold value from the threshold value storage section 90 at step S1802. Then, the level difference decision block 65 compares level differences included in level difference data acquired from the design pattern-level difference relationship storage section 71 by the process at step S1803 with the level difference threshold value to decide whether or not the level difference data include a level difference greater than the level difference threshold value at step S1804.

If the level difference data do not include a level difference greater than the level difference threshold value (OK at step S1804), then the arithmetic operation section 60 does not carry out change of the layout and the process condition but maintains the layout and the process condition at step S1805 similarly as at step S1207.

If the level difference data include a level difference greater than the level difference threshold value (NG at step S1804), then the level difference decision block 65 extracts those level differences which are greater than the level difference threshold value. Then, the presumably defective portion decision block 62 and the changing block 63 carry out the processes at succeeding steps S1806 to S1811 with regard to the extracted level differences.

With the second example of the second embodiment described above, following working effects are exhibited in addition to the working effects exhibited by the second example of the first embodiment.

In the present example, the decision process at step S1804 is carried out based on the magnitude or depth of level differences, and the conditional expression is applied only to comparatively great level differences in the level difference data to carry out the presumably defective portion decision process. Therefore, the calculation amount can be suppressed and the processing tact can be reduced significantly.

2-3. Third Example

Case in which Level Difference Data are Acquired by Calculation

Figure 19:
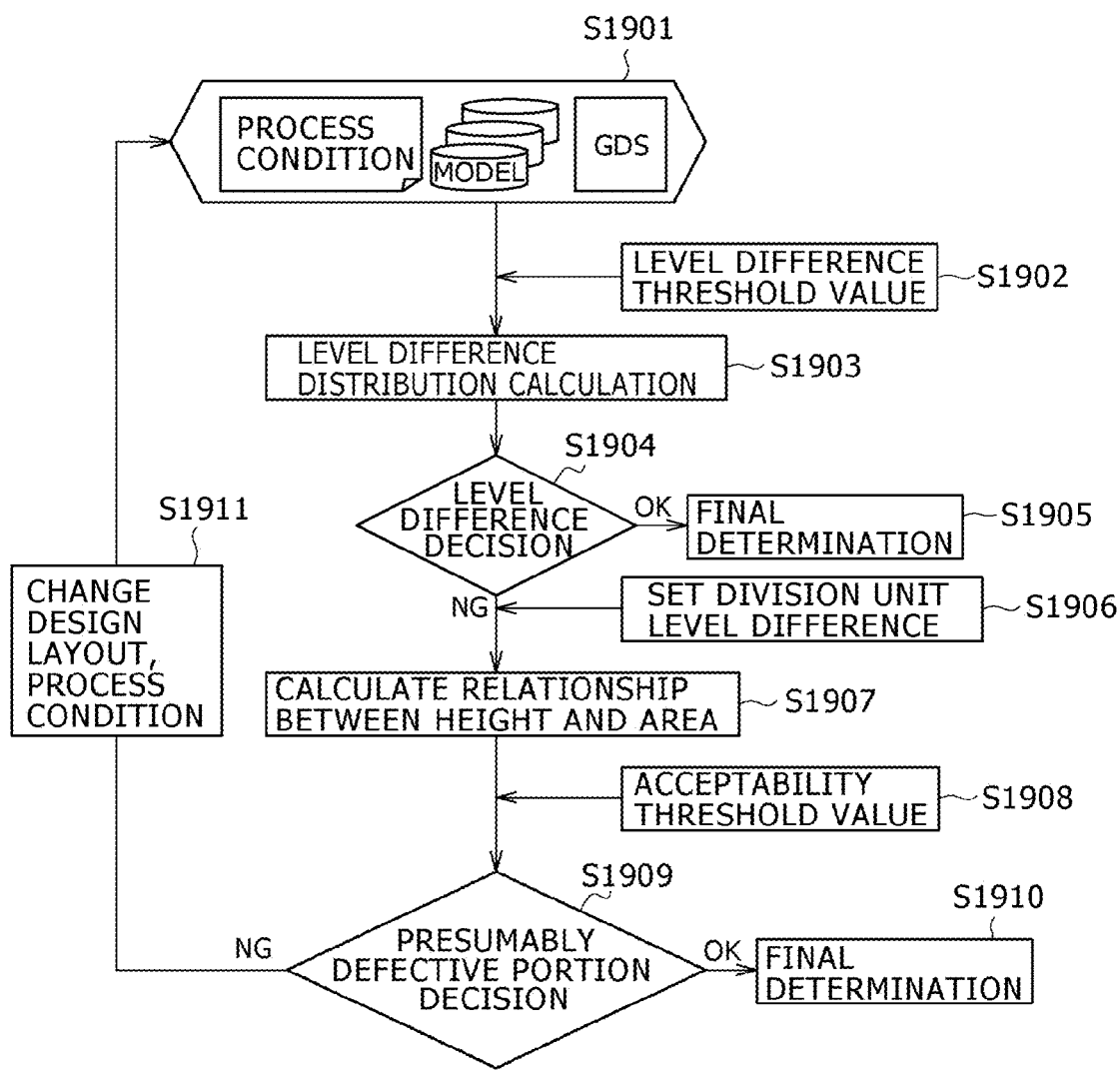
FIG. 19 is a flow chart illustrating a presumably defective portion decision process by a presumably defective portion decision apparatus according to a third example of the second embodiment of the present disclosure.

FIG. 19 is a flow chart illustrating a presumably defective portion decision process by a presumably defective portion decision apparatus according to the third example of the second embodiment.

The flow chart of FIG. 19 is different from the flow chart of FIG. 14 in the third example of the first embodiment in that it additionally includes steps S1902, S1904 and S1905.

Steps S1901, S1903 and S1906 to S1911 correspond to the steps S1401 to S1408 of FIG. 14, respectively, and therefore, overlapping detailed description of them is omitted herein to avoid redundancy.

It is to be noted that the presumably defective portion decision apparatus which executes the flow chart of FIG. 19 includes the level difference decision block 65 described hereinabove in addition to the components of the arithmetic operation section 60 of the presumably defective portion decision apparatus 40-3 according to the third example of the first embodiment shown in FIG. 13.

Referring to FIG. 19, after the process at step S1901 ends, the level difference decision block 65 of the arithmetic operation section 60 reads out the level difference threshold value from the threshold value storage section 90 at step S1902. Then, the level difference decision block 65 compares level differences included in level difference data calculated by the level difference calculation block 64 by the process at step S1903 with the level difference threshold value to decide whether or not the level difference data include a level difference greater than the level difference threshold value at step S1904.

If the level difference data do not include a level difference greater than the level difference threshold value (OK at step S1904), then the arithmetic operation section 60 does not carry out change of the layout and the process condition but finally determines the layout and the process condition at step S1905 similarly as at step S1407.

If the level difference data include a level difference greater than the level difference threshold value (NG at step S1904), then the level difference decision block 65 extracts level differences greater than the level difference threshold value. Then, the presumably defective portion decision block 62 and the changing block 63 carry out the processes at succeeding steps S1906 to S1911 with regard to the extracted level differences.

With the third example of the second embodiment described above, following working effects are exhibited in addition to the working effects exhibited by the third example of the first embodiment.

In the present example, the decision process based on the magnitude or depth of a level difference is carried out at step S1904, and the conditional expression is applied only to comparatively great level differences in the level difference data to carry out the presumably defective portion decision process. Therefore, the calculation amount can be suppressed and the processing tact can be reduced significantly.

3. Third Embodiment

In following first to third examples of a third embodiment, a function of generating a dummy element to raise the flatness, namely, a dummy insertion block, is provided in the presumably defective portion decision apparatus in the first to third examples of the first embodiment.

3-1. First Example

Case in which Level Difference Data are Acquired by Actual Measurement

Figure 20:
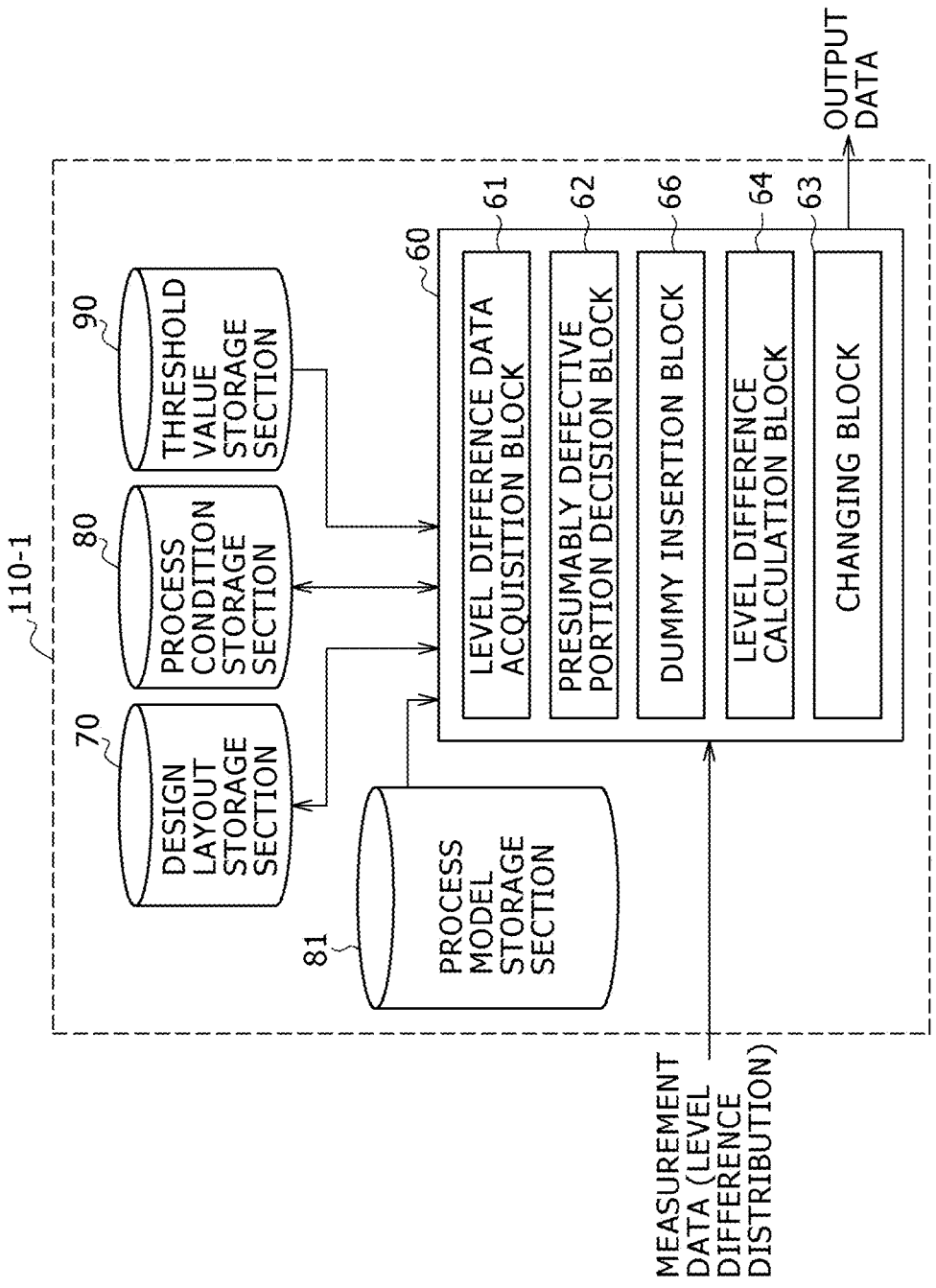
FIG. 20 is a block diagram showing an example of a configuration of a presumably defective portion decision apparatus provided in a fabrication apparatus for a semiconductor device according to a first example of a third embodiment of the present disclosure.

FIG. 20 is a block diagram showing an example of a configuration of a presumably defective portion decision apparatus provided in the fabrication apparatus 50 for a semiconductor device according to the first example of the third embodiment.

A presumably defective portion decision apparatus 110-1 shown in FIG. 20 includes the process model storage section 81, and a dummy insertion block 66 and the level difference calculation block 64 in the arithmetic operation section 60 in addition to the components of the presumably defective portion decision apparatus 40-1 (refer to FIG. 8) according to the first example of the first embodiment. In the following description given with reference to FIG. 20, the difference from FIG. 8 is described principally while description of those components which have like functions or configurations is omitted herein to avoid redundancy.

The presumably defective portion decision apparatus 110-1 includes the arithmetic operation section 60, the design layout storage section 70, the process condition storage section 80, the process model storage section 81 and the threshold value storage section 90.

The dummy insertion block 66 of the arithmetic operation section 60 sets a dummy element to a portion decided to be a presumably defective portion or in the proximity of the portion in level difference data representative of the level difference distribution. The dummy insertion block 66 sets insertion of a dummy element automatically in accordance with a rule determined in advance or by manual operation of the inputting section 52. The material of the dummy element to be inserted is not particularly limited but may be, for example, same as the material of the gate electrode.

Figure 21:
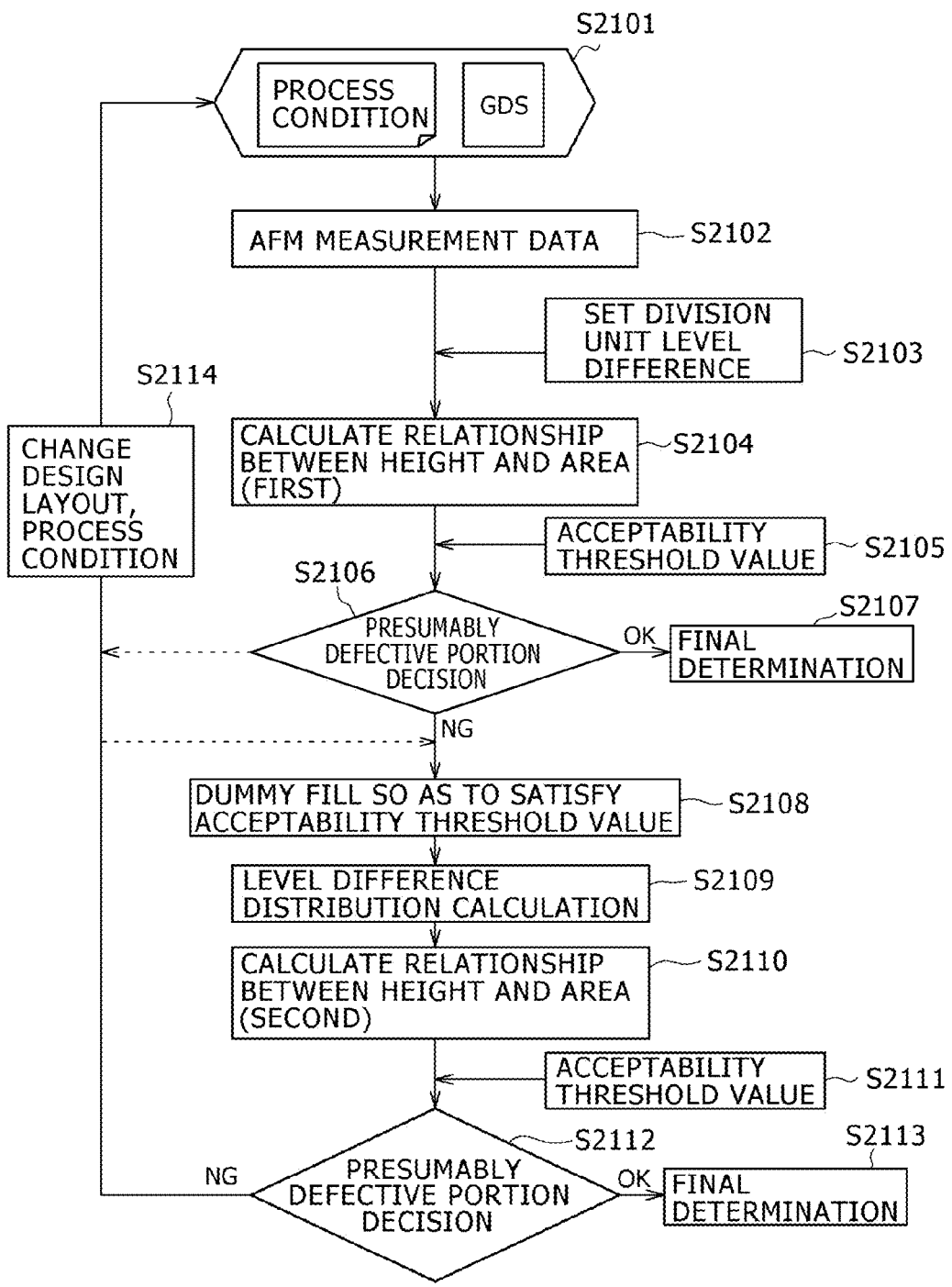
FIG. 21 is a flow chart illustrating a presumably defective portion decision process by the presumably defective portion decision apparatus of FIG. 20.

FIG. 21 is a flow chart illustrating a presumably defective portion decision process by the presumably defective portion decision apparatus 110-1 according to the first example of the third embodiment.

The flow chart of FIG. 21 is different from the flow chart of FIG. 9 in the first example of the first embodiment in that it additionally includes steps S2108 to S2113.

Steps S2101 to S2107 correspond to the steps S901 to S907 of FIG. 9, respectively, and steps S2110 to S2114 correspond to the steps S904 to S908 of FIG. 9, respectively. Therefore, overlapping detailed description of them is omitted herein to avoid redundancy.

Referring to FIG. 21, a presumably defective portion decision process (first time) is carried out with regard to level differences included in level difference data obtained by actual measurement of a semiconductor device at steps S2101 to S2106. In the decision process at step S2106, the presumably defective portion decision block 62 compares the value of the right side of the expression (1) regarding the level differences included in the level difference data obtained by the actual measurement with the acceptability threshold value to decide whether or not there is a presumably defective portion.

If a presumably defective portion is not found, then the arithmetic operation section 60 carries out a process of maintaining the layout and the process condition at step S2107.

If a presumably defective portion is found, then the dummy insertion block 66 inserts a dummy element into the presumably defective portion of the layout (such insertion is hereinafter referred to also as dummy fill) to modify the design pattern at step S2108. In the dummy element insertion process, the size of dummy elements, the pitch between the dummy elements, the shape and direction of arrangement of the dummy elements and so forth are adjusted so that the level differences at the extracted presumably defective portions may be eliminated, namely, so that the design pattern after the dummy element insertion may satisfy the expression (1).

By inserting the dummy elements into the layout in this manner, the dummy elements are filled in those portions which may be presumably defective portions of the design pattern, and the objective flatness can be implemented.

Then, with regard to the layout after the dummy element insertion, the level difference calculation block 64 uses the process model in the process model storage section 81 to calculate the level difference distribution at step S2109. The presumably defective portion decision block 62 divides each of the level differences of the calculated level difference distribution into unit level differences based on the setting of the division unit level difference at step S2103. Then, presumably defective portion decision block 62 substitutes, for each unit level difference, the height of a contour line at the level difference position of the upper face and the area of the opening at the height into the expression (1) to calculate the right side of the expression (1) at step S2110. The process of calculating, for each unit level difference, the relationship between the height of the contour line at the level difference position of the upper face and the area of the opening at the height at step S2110 is a second time processing next to the first time processing at step S2104.

The presumably defective portion decision block 62 compares the value of the right side of the expression (1) and the acceptability threshold value with each other to carry out the presumably defective portion decision process (second time) at step S2112.

If no presumably defective portion is detected, then the arithmetic operation section 60 carries out a process of maintaining the layout and the process condition at step S2113.

If a presumably defective portion is present, then the changing block 63 carries out a process of changing the layout and the process condition at step S2114.

With the first example of the third embodiment described above, following working effects are exhibited in addition to the working effects exhibited by the first example of the first embodiment.

In the present example, three choices of modification of the design pattern, change of the process condition and insertion of a dummy are available. By suitably selecting from the three choices in response to an appearance situation of presumably defective portions, a higher degree of flatness can be implemented with the semiconductor device surface.

One of characteristics of the present example resides in optimization of a dummy element using the level difference shape of the semiconductor device surface, namely, the wafer. If the relationship between the level difference shape and the flatness of the semiconductor device surface is universally applicable, then it is possible to find out a particular relationship between them, optimize a dummy element to be inserted using the relationship and further optimize the layout.

It is to be noted that the changing block 63 may serve also as the dummy insertion block 66. Since insertion of a dummy element can be considered to be one of design pattern changes of the layout, insertion and arrangement of a dummy element are determined by the changing block 63.

The particular examples and the modifications in the first example of the third embodiment can naturally be applied also to the second example and the third example of the third embodiment hereinafter described. Furthermore, they can be applied also to the fourth embodiment and the fifth embodiment hereinafter described.

3-2. Second Example

Case in which Level Difference Data are Acquired by Supposition

Figure 22:
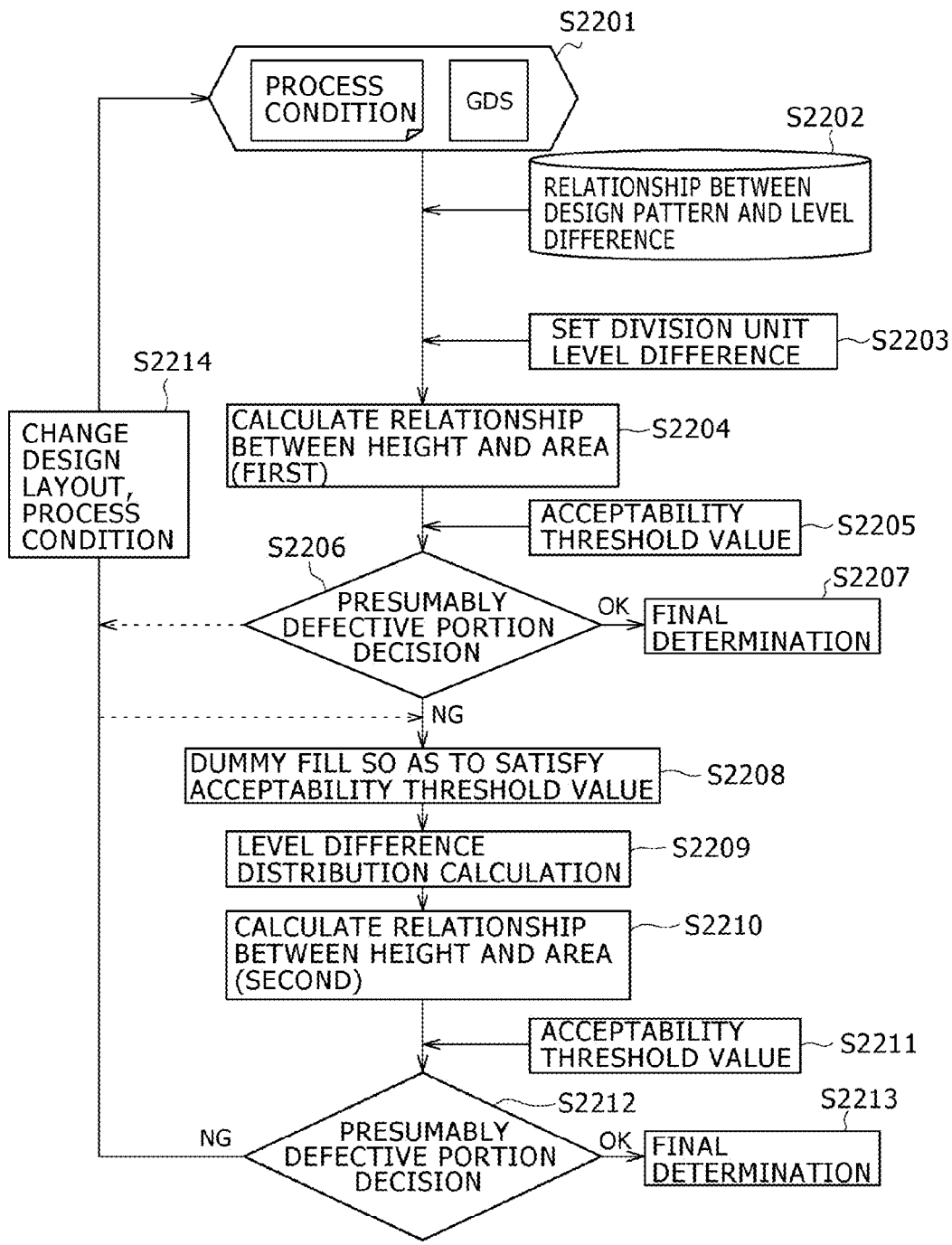
FIG. 22 is a flow chart illustrating a presumably defective portion decision process by a presumably defective portion decision apparatus according to a second example of the third embodiment of the present disclosure.

FIG. 22 is a flow chart illustrating a presumably defective portion decision process by a presumably defective portion decision apparatus according to the second example of the third embodiment.

The flow chart of FIG. 22 is different from the flow chart of FIG. 12 in the second example of the first embodiment in that it additionally includes steps S2208 to S2213.

Steps S2201 to S2207 correspond to the steps S1201 to S1207 of FIG. 12, and steps S2210 to S2214 correspond to the steps S1204 to S1208 of FIG. 12, respectively.

The processes at steps S2201 to S2214 correspond to the processes at steps S2101 to S2114 of the flow chart of FIG. 21 in the first example of the third embodiment, respectively, except the process at step S2202. They are different in the acquisition method of level difference data.

From the foregoing, overlapping detailed description of processes in FIG. 22 corresponding or similar to the other processes is omitted herein to avoid redundancy.

It is to be noted that the presumably defective portion decision apparatus which executes the flow chart of FIG. 22 includes the process model storage section 81, and the dummy insertion block 66 and the level difference calculation block 64 in the arithmetic operation section 60 in addition to the components of the presumably defective portion decision apparatus 40-2 shown in FIG. 11.

Referring to FIG. 22, processes at steps S2201 to S2206 are carried out first. In the presumably defective portion decision process (first time) at step S2206, the presumably defective portion decision block 62 compares the value of the right side of the expression (1) and the acceptability threshold value with each other with regard to the level differences included in the level difference data obtained from the design pattern-level difference relationship storage section 71 to decide whether or not there is a presumably defective portion.

If no presumably defective portion is detected, then the layout and the process condition are finally determined at step S2207.

If a presumably defective portion is detected, then the arithmetic operation section 60 carries out an insertion process of a dummy element so that the condition of the acceptability threshold value may be satisfied at step S2208. Then, the level difference calculation block 64 carries out level difference distribution calculation regarding the design pattern after the dummy element insertion at step S2209 and carries out the presumably defective portion decision process for the second time with regard to the calculated level differences of the level difference data at steps S2210 to S2212.

If a presumably defective portion is not detected, then the layout and the process condition are finally determined at step S2213. If a presumably defective portion is detected, then the changing block 63 carries out a process of changing the layout and the process condition at step S2214.

With the second example of the third embodiment described above, following working effects are exhibited in addition to the working effects exhibited by the second example of the first embodiment.

The present example provides choices of modification of the design pattern, change of the process condition and insertion of a dummy element. By suitably selecting from the three choices to carry out a suitable countermeasure in response to an appearance situation of presumably defective portions, a higher degree of flatness of the semiconductor device surface can be achieved.

One of characteristics of the present example resides in optimization of a dummy element using the level difference shape of the semiconductor device surface or wafer. If the relationship between the level difference shape and the flatness of the semiconductor device surface is universally applicable, then it is possible to find out a particular relationship between them, optimize a dummy element to be inserted using the relationship and further optimize the layout.

3-3. Third Example

Case in which Level Difference Data are Acquired by Calculation

Figure 23:
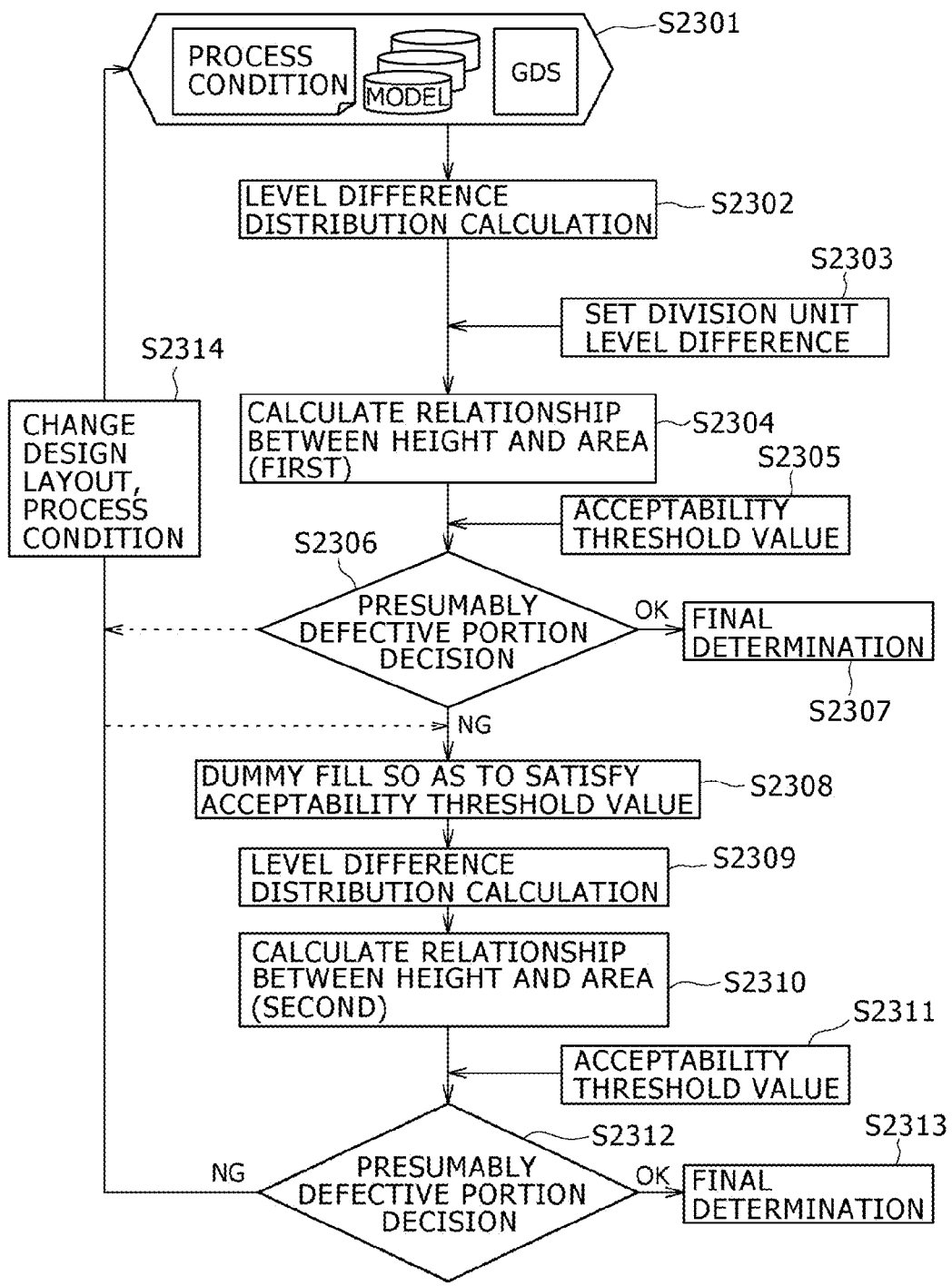
FIG. 23 is a flow chart illustrating a presumably defective portion decision process by a presumably defective portion decision apparatus according to a third example of the third embodiment of the present disclosure.

FIG. 23 is a flow chart illustrating a presumably defective portion decision process by a presumably defective portion decision apparatus according to the third example of the third embodiment.

The flow chart of FIG. 23 is different from the flow chart of FIG. 14 in the third example of the first embodiment in that it additionally includes steps S2308 to S2313.

Steps S2301 to S2307 correspond to the steps S1401 to S1407 of FIG. 14, and steps S2310 to S2314 correspond to the steps S1404 to S1408 of FIG. 14, respectively.

Further, the processes at steps S2301 to S2314 correspond to the processes at steps S2101 to S2114 of the flow chart of FIG. 21 regarding the first example of the third embodiment except the process at step S2302. They are different in an acquisition method of level difference data.

From the foregoing, overlapping detailed description of the processes in FIG. 23 corresponding or similar to the other processes is omitted herein to avoid redundancy.

It is to be noted that the presumably defective portion decision apparatus which executes the flow chart of FIG. 23 includes the dummy insertion block 66 described hereinabove in the arithmetic operation section 60 in addition to the components of the presumably defective portion decision apparatus 40-3 shown in FIG. 13.

Referring to FIG. 23, processes at steps S2301 to S2306 are carried out first. In the presumably defective portion decision process (first time) at step S2306, the presumably defective portion decision block 62 compares the value of the right side of the expression (1) and the acceptability threshold value with each other with regard to level differences included in the level difference data calculated from the layout and the process model to decide whether or not there is a presumably defective portion.

Here, if no presumably defective portion is detected, then the layout and the process condition are finally determined at step S2307.

On the other hand, if a presumably defective portion is detected at step S2306, then the arithmetic operation section 60 carries out an insertion process of a dummy element so as to satisfy the condition of the acceptability threshold value at step S2308. Then, the arithmetic operation section 60 carries out level difference distribution calculation with regard to the design pattern after the dummy element insertion at step S2309 and then carries out the presumably defective portion decision process for the second time with regard to the calculated level differences of the level difference data at steps S2310 to S2312.

Then, if no presumably defective portion is detected, then the layout and the process condition are finally settled at step S2313. On the other hand, if a presumably defective portion is detected, then the changing block 63 carries out a process of changing the layout and the process condition at step S2314.

With the third example of the third embodiment described above, the following working effects are exhibited in addition to the working effects exhibited by the third example of the first embodiment.

The present example provides choices regarding modification of the design pattern, change of the process condition and insertion of a dummy element. By suitably selecting the three choices in response to an appearance situation of a presumably defective portion, a higher degree of flatness of the semiconductor device surface can be implemented.

One of characteristic of the present example resides in that a level difference shape of the semiconductor device surface or wafer to optimize a dummy element. If the relationship between the level difference shape and the flatness of the semiconductor device surface is universally applicable, then it is possible to find out a particular relationship between them, optimize a dummy element to be inserted using the relationship and further optimize the layout.

4. Fourth Embodiment

First to third examples of the fourth embodiment described below are configured such that a filtering function, namely, a level difference decision block, for the depth of level differences in the second embodiment is provided in the presumably defective portion decision apparatus of the first to third examples of the third embodiment.

4-1. First Example

Case in which Level Difference Data are Acquired by Actual Measurement

Figure 24:
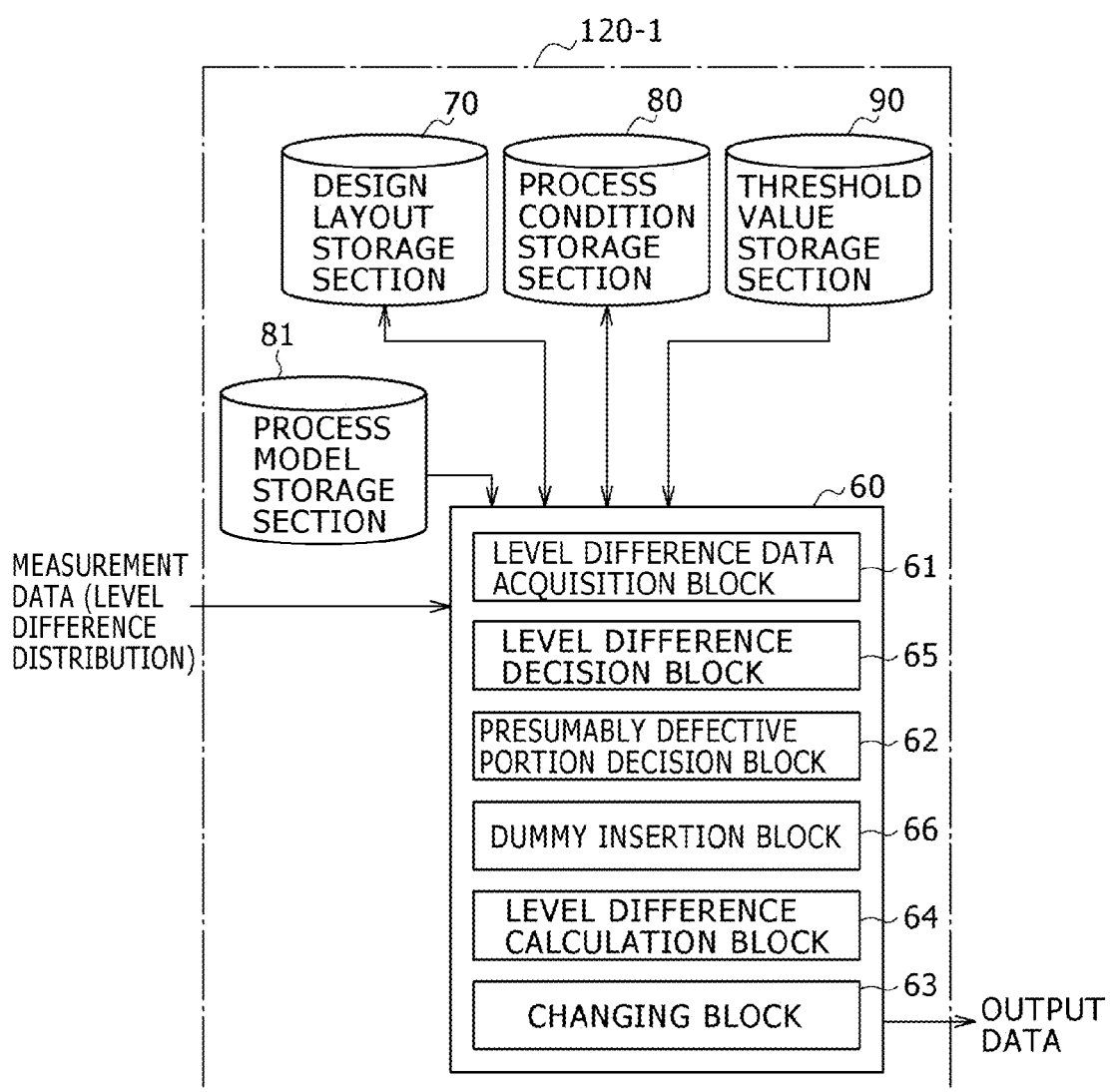
FIG. 24 is a block diagram showing an example of a configuration of a presumably defective portion decision apparatus provided in a fabrication apparatus for a semiconductor device according to a first example of a fourth embodiment of the present disclosure.

FIG. 24 is a block diagram showing an example of a configuration of a presumably defective portion decision apparatus provided in a fabrication apparatus 50 for a semiconductor device according to a first example of the fourth embodiment.

A presumably defective portion decision apparatus 120-1 shown in FIG. 24 includes a level difference decision block 65 in an arithmetic operation section 60 in addition to the components of the presumably defective portion decision apparatus 110-1 according to the first example of the third embodiment shown in FIG. 20. In the following description given with reference to FIG. 24, the difference from FIG. 20 is described principally while description of those components which have like functions or configurations is omitted herein by denoting same reference symbols to avoid redundancy.

Figure 25:
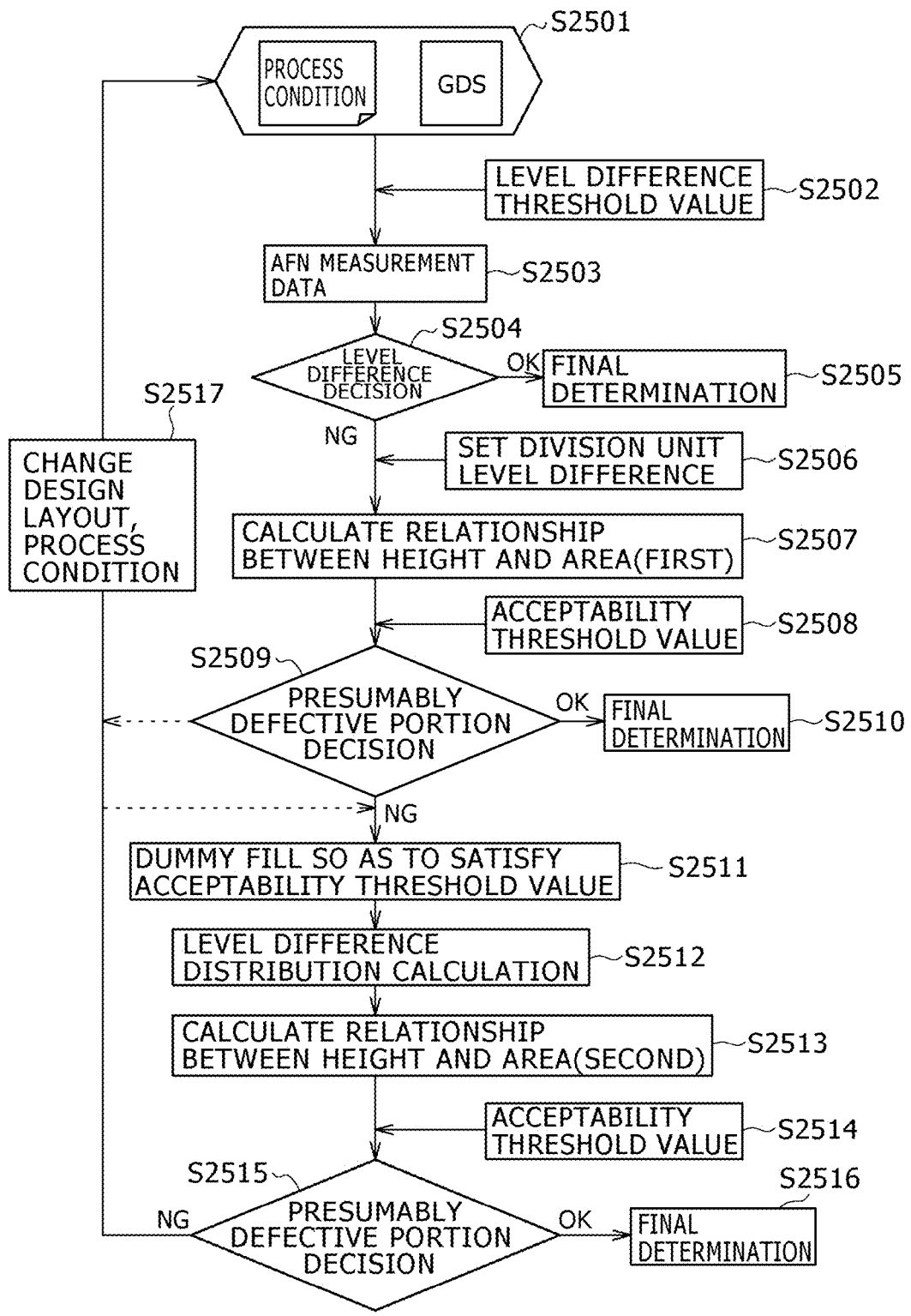
FIG. 25 is a flow chart illustrating a presumably defective portion decision process by the presumably defective portion decision apparatus of FIG. 24.

FIG. 25 is a flow chart illustrating a presumably defective portion decision process by the presumably defective portion decision apparatus 120-1 according to the first example of the fourth embodiment.

The flow chart of FIG. 25 is different from the flow chart of FIG. 21 in the first example of the third embodiment in that it additionally includes steps S2502 and S2504 to S2505.

Steps S2501, S2503 and S2506 to S2517 correspond to the steps S2101 to S2114, and steps S2502 and S2504 to S2505 correspond to the steps S1602 and S1604 to S1605, in FIG. 16, respectively.

Further, the steps S2501 to S2510 correspond to the steps S1601 to S1610 of the flow chart of FIG. 16 regarding the first example of the second embodiment.

From the foregoing, overlapping detailed description of processes in FIG. 25 corresponding or similar to the other processes is omitted herein to avoid redundancy.

Referring to FIG. 25, a filtering processing, namely, level difference decision, with regard to the depth of level differences included in level difference data of a semiconductor device is carried out at steps S2501 to S2504. In the decision process at step S2504, the level difference decision block 65 decides whether or not the level difference data obtained by actual measurement include a level difference greater or deeper than the level difference threshold value to extract level differences greater than the level difference threshold value (NG at step S2504). For example, in the present embodiment, the acceptability threshold value is 100 nm.

If a level difference greater than the level difference threshold value is not detected (OK at step S2504), then the arithmetic operation section 60 carries out change of the layout and the process condition similarly as at step S1605 but carries out a process of maintaining the layout and the process condition at step S2505.

Then, with regard to the level differences extracted by the level difference decision block 65, the presumably defective portion decision block 62 executes a presumably defective portion decision process for the first time at steps S2506 to S2509.

If no presumably defective portion is detected, then the arithmetic operation section 60 carries out a process of maintaining the layout and the process condition at step S2510.

Then, if a presumably defective portion is detected, then the dummy insertion block 66 carries out a process of inserting a dummy element into the presumably defective portions of the layout so as to satisfy the condition of the acceptability threshold value at step S2511.

Then, the presumably defective portion decision block 62 carries out the presumably defective portion decision process for the second time with regard to the layout after the dummy element insertion at steps S2512 to S2515.

If no presumably defective portion is detected, then the arithmetic operation section 60 carries out a process of maintaining the layout and the process condition at step S2516.

If a presumably defective portion is detected, then the changing block 63 carries out a process of changing the layout and the process condition at step S2517.

With the first example of the fourth embodiment described above, the following working effects are exhibited in addition to the working effects exhibited by the first example of the third embodiment.

In the present example, the decision process at step S2504 is carried out based on the magnitude or depth of the level difference, and the presumably defective portion decision process is carried out applying the conditional expression only to comparatively great level differences in the level difference data. Therefore, the calculation amount can be suppressed and the processing tact can be reduced significantly.

It is to be noted that the particular examples and the modifications in the first example of the fourth embodiment can naturally be applied also to the second example and the third example of the fourth embodiment hereinafter described.

4-2. Second Example

Case in which Level Difference Data are Acquired by Supposition

Figure 26:
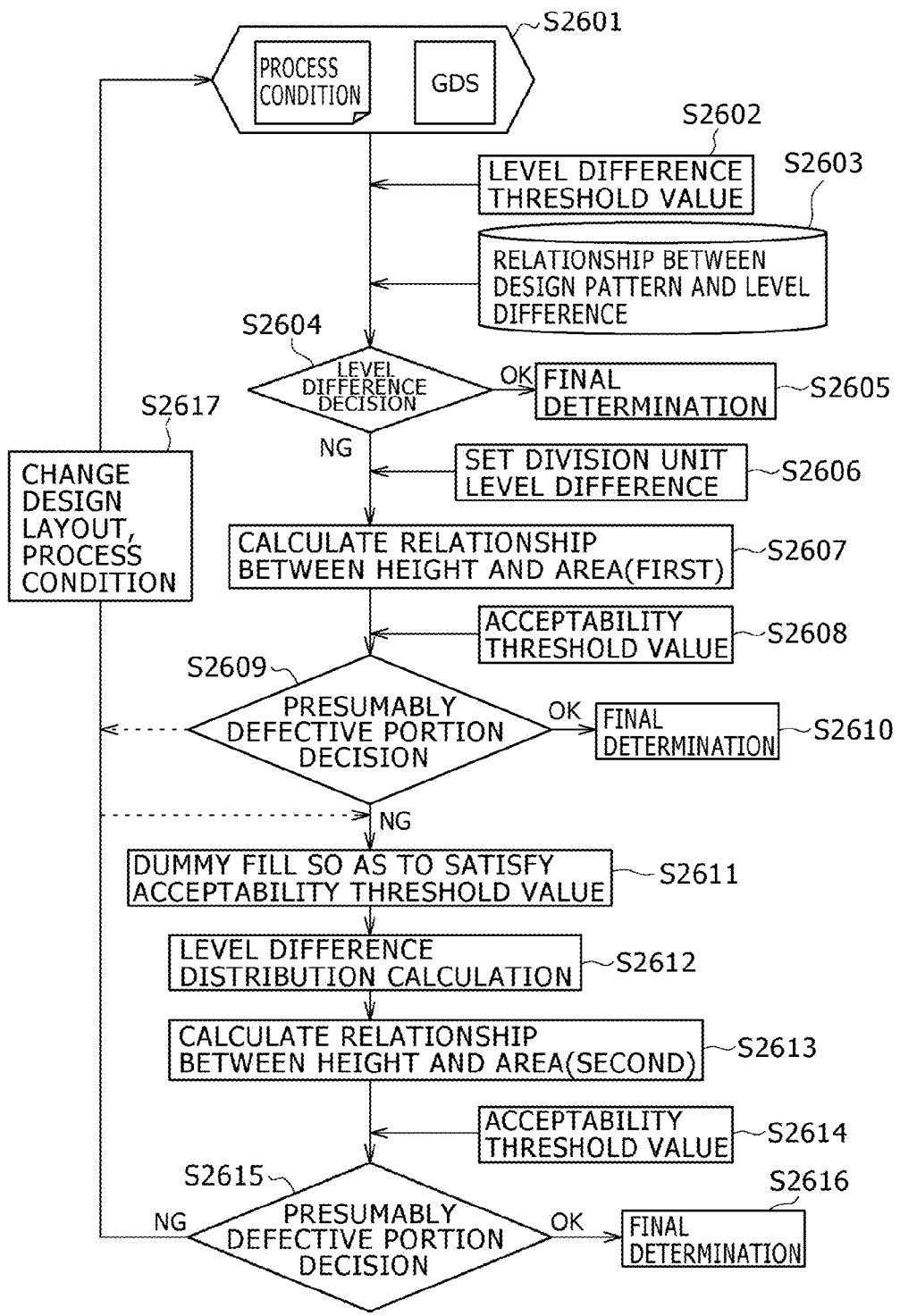
FIG. 26 is a flow chart illustrating a presumably defective portion decision process by a presumably defective portion decision apparatus according to a second example of the fourth embodiment of the present disclosure.

FIG. 26 is a flow chart illustrating a presumably defective portion decision process by the presumably defective portion decision apparatus according to a second example of the fourth embodiment.

The flow chart of FIG. 26 is different from the flow chart of FIG. 22 in the second embodiment of the third embodiment in that it additionally includes steps S2602 and S2604 to S2605.

Steps S2601, S2603 and S2606 to S2617 correspond to the steps S2201 to S2214 of FIG. 22, and steps S2602 and S2604 to S2605 correspond to the steps S1802 and S1804 to S1805 of FIG. 18, respectively.

Further, steps S2601 to S2610 correspond to the steps S1801 to S1810 of the flow chart of FIG. 18 regarding the second example of the second embodiment.

Further, the processes at steps S2601 to S2617 correspond to the processes at steps S2501 to S2517 of the flow chart of FIG. 25 in the first example of the fourth embodiment, respectively. However, they are different in the acquisition method of level difference data.

From the foregoing, overlapping detailed description of processes in FIG. 26 corresponding or similar to the other processes is omitted herein to avoid redundancy.

It is to be noted that the presumably defective portion decision apparatus which executes the flow chart of FIG. 26 can be configured by providing the design pattern-level difference relationship storage section 71 in addition to the components of the presumably defective portion decision apparatus 120-1 shown in FIG. 24.

Referring to FIG. 26, a filtering process, namely, a level difference decision, is carried out with regard to the depth of level differences included in level difference data of a semiconductor device is carried out at steps S2601 to S2604. In the decision process at step S2604, the level difference decision block 65 decides whether or not the level difference data obtained from the design pattern-level difference relationship storage section 71 include a great or deep level difference to extract those level differences which are greater than the level difference threshold value (NG at step S2604). For example, in the present embodiment, the level difference threshold value is 100 nm.

If a level difference greater than the level difference threshold value is not detected (OK at step S2604), then the layout and the process condition are finally determined at step S2605.

Then, the presumably defective portion decision block 62 carries out a presumably defective portion decision process for the first time with regard to the level differences extracted by the level difference decision block 65 at steps S2606 to S2609.

If a presumably defective portion is not detected, then the dummy insertion block 66 finally determines the layout and the process condition at step S2610. However, if a presumably defective portion is detected, then the dummy insertion block 66 carries out a process of inserting a dummy element into the presumably defective portions of the layout so as to satisfy the acceptability threshold value at step S2611.

Then, the presumably defective portion decision block 62 carries out the presumably defective portion decision process for the second time with regard to the layout after the dummy element insertion at steps S2612 to S2615.

If no presumably defective portion is detected, then the layout and the process condition are finally determined at steps S2616. On the other hand, if a presumably defective portion is detected, then the changing block 63 carries out a process of changing the layout, the process condition and so forth at steps S2617.

With the second example of the fourth embodiment described above, the following working effects are exhibited in addition to the working effects exhibited by the second example of the third embodiment.

In the present example, the decision process at step S2604 is carried out based on the magnitude or depth of a level difference, and the presumably defective portion decision process is carried out applying the conditional expression only to comparatively great level differences in the level difference data. Therefore, the calculation amount can be suppressed and the processing tact can be reduced significantly.

4-3. Third Example

Case in which Level Difference Data are Acquired by Calculation

Figure 27:
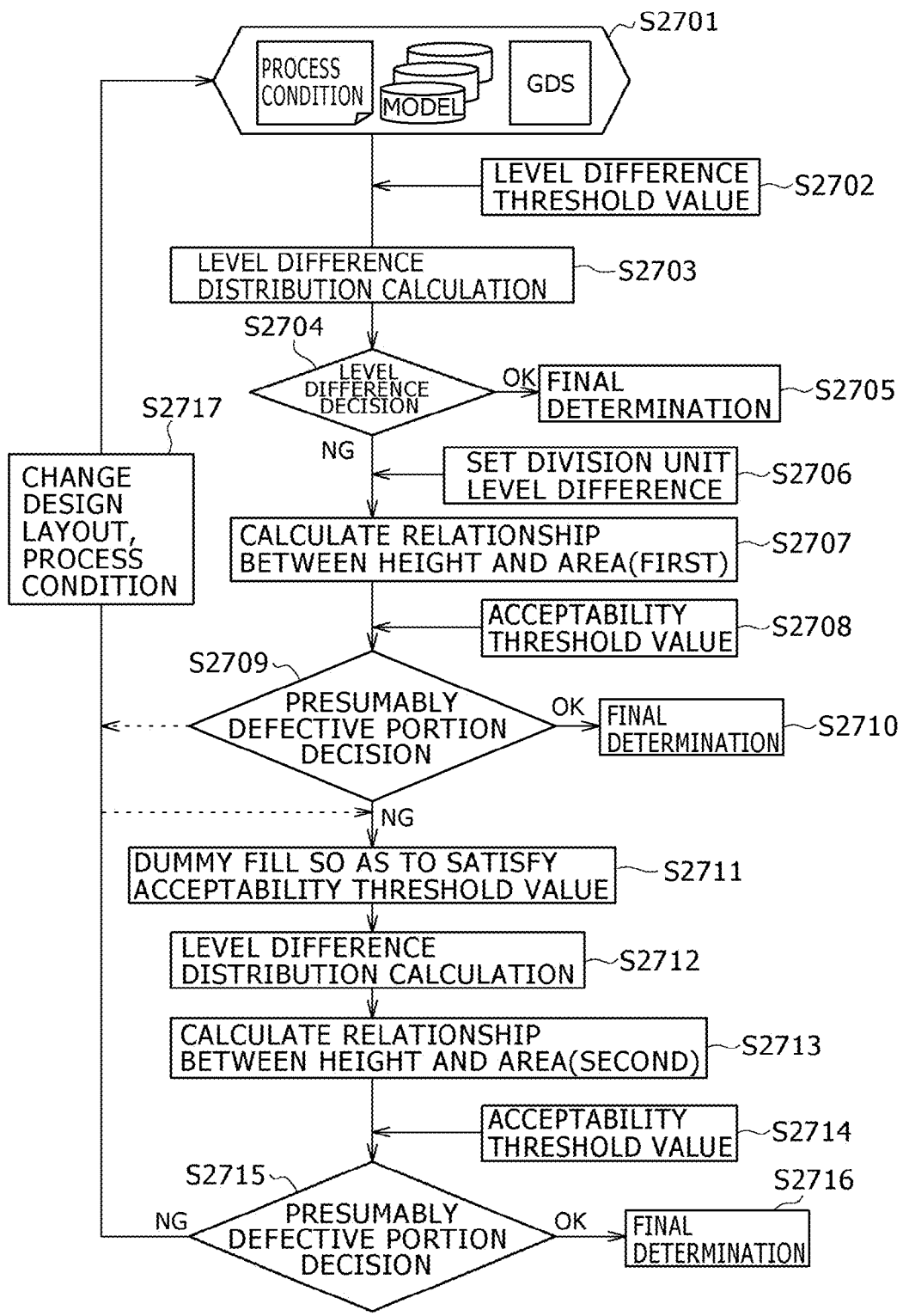
FIG. 27 is a flow chart illustrating a presumably defective portion decision process by a presumably defective portion decision apparatus according to a third example of the fourth embodiment of the present disclosure.

FIG. 27 is a flow chart illustrating a presumably defective portion decision process by the presumably defective portion decision apparatus according to the third example of the fourth embodiment of the present disclosure.

The flow chart of FIG. 27 is different from the flow chart of FIG. 23 in the third example of the third embodiment in that it additionally includes steps S2702 and S2704 to S2705.

Steps S2701, S2703 and S2706 to S2717 correspond to the steps S2301 to S2314 and steps S2702 and S2704 to S2705 correspond to the steps S1902, S1904 to S1905 of the flow chart of FIG. 19 in the third example of the second embodiment, respectively.

Further, the steps S2701 to S2710 correspond to the steps S1901 to S1910 of the flow chart of FIG. 19 in the third example of the second embodiment.

Further, the processes at steps S2701 to S2717 except a process at step S2703 correspond to the processes at steps S2501 to S2517 of the flow chart of FIG. 25 in the first example of the fourth embodiment, respectively. However, they are different in the acquisition method of level difference data.

From the foregoing, overlapping detailed description of processes in FIG. 27 corresponding or similar to the other processes is omitted herein to avoid redundancy.

It is to be noted that the presumably defective portion decision apparatus which executes the flow chart of FIG. 27 can be configured by providing the design pattern-level difference relationship storage section 71 in addition to the components of the presumably defective portion decision apparatus 120-1 shown in FIG. 24.

Referring to FIG. 27, a filtering process, namely, level difference decision, is carried out with regard to the depth of level differences included in level difference data of a semiconductor device at steps S2701 to S2704. In the decision process at step S2704, the level difference decision block 65 decides whether or not the level difference data calculated from the layout and the process model include a great or deep level difference to extract those level differences which are greater than the level difference threshold value (NG at step S2704). For example, in the present embodiment, the level difference threshold value is 100 nm.

If a level difference greater than the level difference threshold value is not detected (OK at step S2704), then the layout and the process condition are finally determined at step S2705.

Then, the presumably defective portion decision block 62 carries out a presumably defective portion decision process for the first time with regard to the level differences extracted by the level difference decision block 65 at steps S2706 to S2709.

If a presumably defective portion is not detected, the layout and the process condition are finally determined at step S2710.

However, if a presumably defective portion is detected, then the dummy insertion block 66 carries out a process of inserting a dummy element into the presumably defective portions of the layout so as to satisfy the acceptability threshold value at step S2711.

Then, the presumably defective portion decision block 62 carries out the presumably defective portion decision process for the second time with regard to the layout after the dummy element insertion at steps S2712 to S2715.

If no presumably defective portion is detected, then the layout and the process condition are finally determined at steps S2716. On the other hand, if a presumably defective portion is detected, then the changing block 63 carries out a process of changing the layout, the process condition and so forth at steps S2717.

With the third example of the fourth embodiment described above, the following working effects are exhibited in addition to the working effects exhibited by the third example of the third embodiment.

In the present example, the decision process based on the magnitude or depth of a level difference is carried out at step S2704, and the presumably defective portion decision process is carried out applying the conditional expression only to comparatively great level differences in the level difference data. Therefore, the calculation amount can be suppressed and the processing tact can be reduced significantly.

5. Fifth Embodiment

First to third examples of the fifth embodiment described below are configured such that a function of inserting a dummy element which reflects a level difference threshold value and a function of deleting an inserted dummy element, namely, a dummy deleting function, are provided in the presumably defective portion decision apparatus of the first to third examples of the fourth embodiment.

5-1. First Example

Case in which Level Difference Data are Acquired by Actual Measurement

Figure 28:
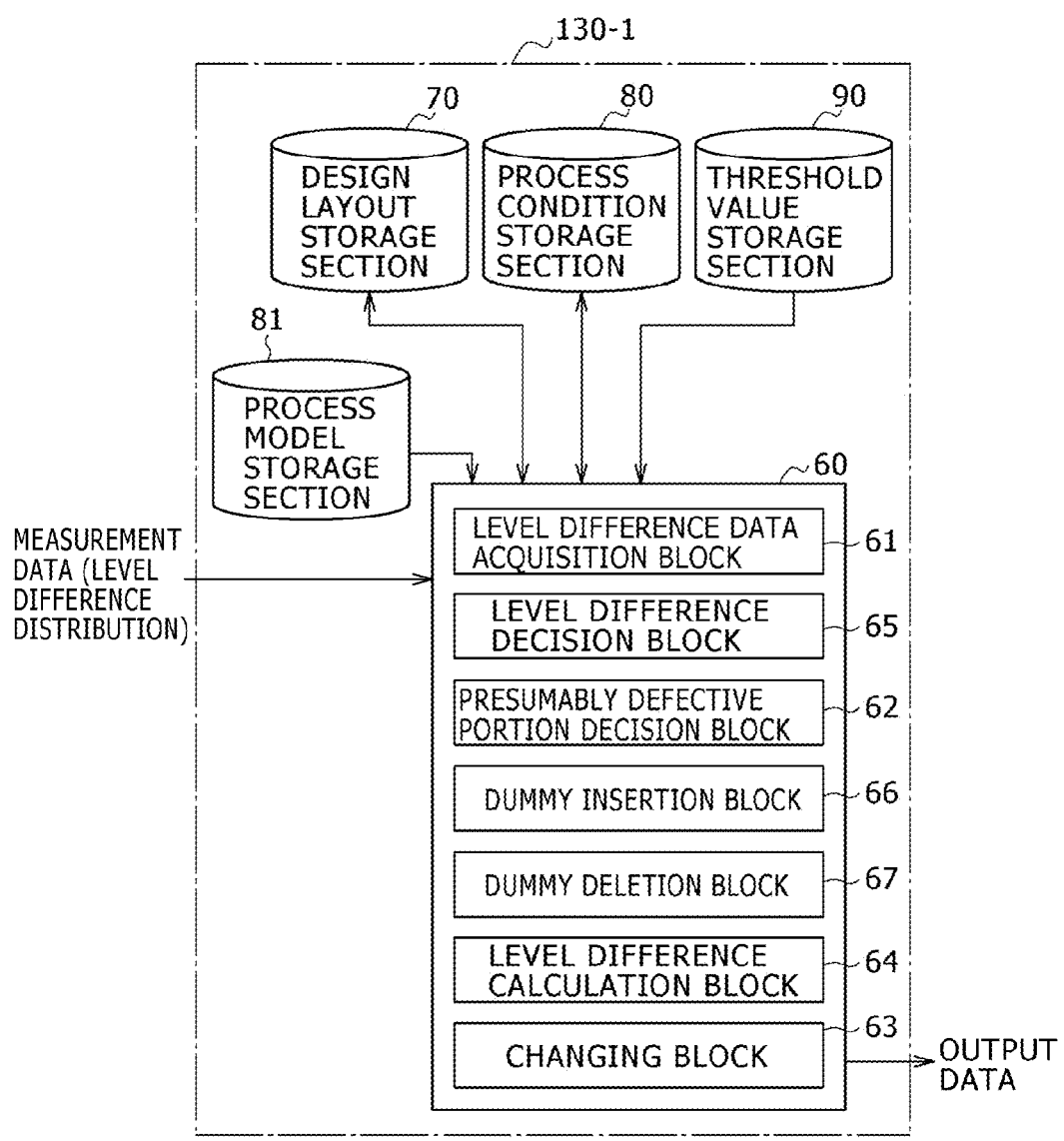
FIG. 28 is a block diagram showing an example of a configuration of a presumably defective portion decision apparatus provided in a fabrication apparatus for a semiconductor device according to a first example of a fifth embodiment of the present disclosure.

FIG. 28 is a block diagram showing an example of a configuration of a presumably defective portion decision apparatus provided in a fabrication apparatus 50 for a semiconductor device according to a first example of the fifth embodiment.

The presumably defective portion decision apparatus 130-1 shown in FIG. 28 includes a dummy deletion block 67 in an arithmetic operation section 60 in addition to the components of the presumably defective portion decision apparatus 120-1 according to the first example of the fourth embodiment shown in FIG. 24. In the following description given with reference to FIG. 28, the difference from FIG. 24 is described principally while description of those components which have like functions or configurations is omitted herein by denoting same reference symbols to avoid redundancy.

The presumably defective portion decision apparatus 130-1 includes an arithmetic operation section 60, a design layout storage section 70, a design pattern-level difference relationship storage section 71, a process condition storage section 80, a process model storage section 81 and a threshold value storage section 90.

The dummy deletion block 67 includes a function of deleting a dummy element inserted into the layout by the dummy insertion block. The dummy deletion block 67 deletes a dummy element automatically in accordance with a rule determined in advance or by manual operation of the inputting section 52.

What becomes a target of deletion like is such a dummy element like, for example, dummy elements 33-2 and 33-3 shown in FIG. 5. In the case where the dummy fill is carried out in response to the space of a design pattern in the layout, a dummy element is disposed at fixed intervals in the space, for example, between different wiring line portions. As described hereinabove, the recess 37-2 has a moderate level difference, and therefore, in the recess 37-2, short-circuiting is less likely to occur even if the recess 37-2 does not include a dummy element. Therefore, when a dummy element is to be deleted taking a balance with the data amount of the entire layout into consideration, preferably the deletion is carried out beginning with such a dummy element as described above.

Figure 29:
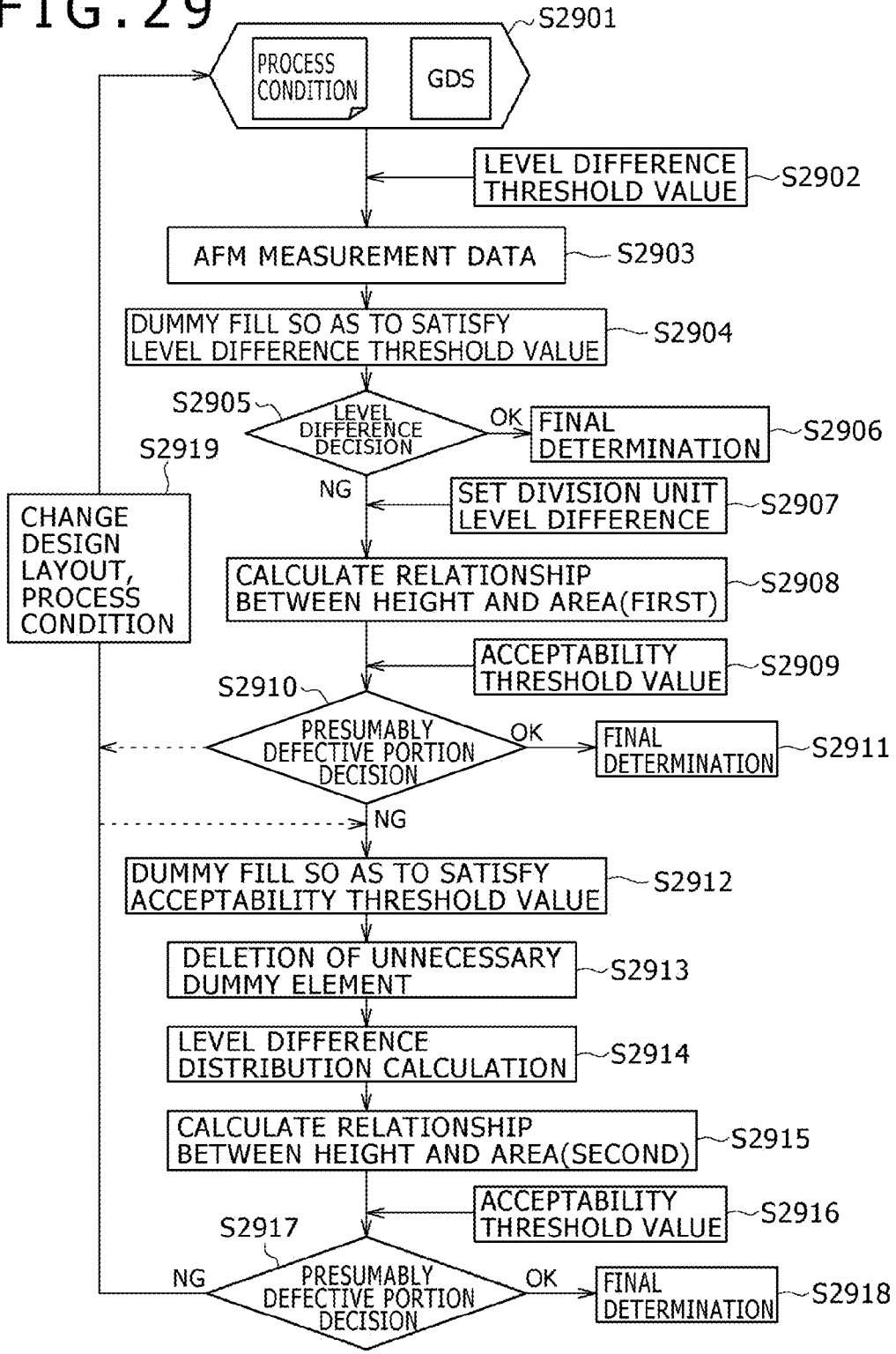
FIG. 29 is a flow chart illustrating a presumably defective portion decision process by the presumably defective portion decision apparatus of FIG. 28.

FIG. 29 is a flow chart illustrating a presumably defective portion decision process by the presumably defective portion decision apparatus according to the first example of the fifth embodiment.

The flow chart of FIG. 29 is different from the flow chart of FIG. 25 relating to the first example of the fourth embodiment in that it additionally includes steps S2904 and S2913.

Steps S2901 to S2903, S2905 to S2912 and S2914 to S2919 correspond to the steps S2501 to S2517 of FIG. 25, respectively.

From the foregoing, overlapping detailed description of processes in FIG. 29 corresponding or similar to the other processes is omitted herein to avoid redundancy.

Referring to FIG. 29, the arithmetic operation section 60 acquires level difference data representative of a level difference distribution of the surface of a semiconductor device at steps S2901 to S2903. In the present example, the level difference data acquisition block 61 acquires level difference data from values obtained by actual measurement of the level differences of the semiconductor device surface after polishing. At step S2902, the level difference threshold value is read out from the threshold value storage section 90. In the present example, the level difference threshold value is 100 nm as an example.

Then, the dummy insertion block 66 carries out insertion of a dummy element, namely, dummy fill, into each portion at which a level difference greater than, for example, 100 nm exists so that the design pattern after the dummy element insertion may satisfy the condition of the level difference threshold value at step S2904.

After the insertion of a dummy element, the level difference decision block 65 carries out a filtering process, namely, level difference decision, with regard to the depth of the level differences included in the level difference data at step S2905. The level difference decision block 65 decides whether or not there is a level difference greater, namely, deeper, than the level difference threshold value in the level difference data to extract those level differences which are greater than the level difference threshold value (NG at step S2905).

If a level difference greater than the level difference threshold value is not detected (OK at step S2905), then the arithmetic operation section 60 does not carry out change of the layout and the process condition but carries out a process of maintaining the layout and the process condition at step S2906.

Then, with regard to the level differences extracted by the level difference decision block 65, the presumably defective portion decision block 62 carries out a presumably defective portion decision process for the first time at steps S2907 to S2910.

If no presumably defective portion is detected, then the arithmetic operation section 60 carries out a process of maintaining the layout and the process condition at step S2911.

On the other hand, if a presumably defective portion is detected, then the dummy insertion block 66 carries out a process of inserting a dummy element into the presumably defective portions of the layout so as to satisfy the acceptability threshold value at step S2912.

Then, if the dummy elements inserted at steps S2904 and S2912 include some unnecessary element, then the dummy deletion block 67 carries out a process of deleting such unnecessary dummy element while leaving necessary elements automatically or by manual operation at step S2913.

If the accuracy of level difference control is raised, then the total amount of dummy elements to be inserted increases and the data size of the entire layout increases. Therefore, it is preferable to remove unnecessary dummy elements as far as possible. If insertion of a dummy element in which a level difference threshold value is used is carried out, for example, applying a rule such as, for example, DRC (Design Rule Checking), then many dummy elements may be filled into portions for which insertion of a dummy element is not required. In the present example, by deleting such dummy elements automatically or by manual operation, the data amount can be reduced.

Then, the presumably defective portion decision block 62 carries out the presumably defective portion decision process for the second time with regard to the layout after the dummy element deletion at steps S2914 to S2917. At step S2914, the level difference calculation block 64 carries out level difference distribution calculation for the layout after the insertion process and the deletion process of a dummy element are carried out to calculate level difference data.

If no presumably defective portion is detected, then the arithmetic operation section 60 carries out a process of maintaining the layout and the process condition at step S2918.

On the other hand, if a presumably defective portion is detected, then the changing block 63 carries out a process of changing the layout and the process condition at step S2919.

With the first example of the fifth embodiment described above, the following working effects are exhibited in addition to the working effects exhibited by the first example of the fourth embodiment.

In the present example, since a dummy element is disposed so as to satisfy the condition of the level difference threshold value, those level differences which are greater than the level difference threshold value decrease. Since the presumably defective portion decision process is carried out after such level differences which are greater than the level difference threshold value are decreased, the calculation amount can be suppressed and the processing tact can be reduced significantly.

Further, if the dummy element decision function is added such that both of insertion and deletion of a dummy element are carried out in combination, optimization of the dummy element and hence optimization of the layout can be implemented.

Furthermore, since it becomes possible to dispose only necessary dummy elements on the layout, reduction of the data amount of the entire layout and enhancement of the efficiency of the series of processes can be achieved.

5-2. Second Example

Case in which Level Difference Data are Acquired by Supposition

Figure 30:
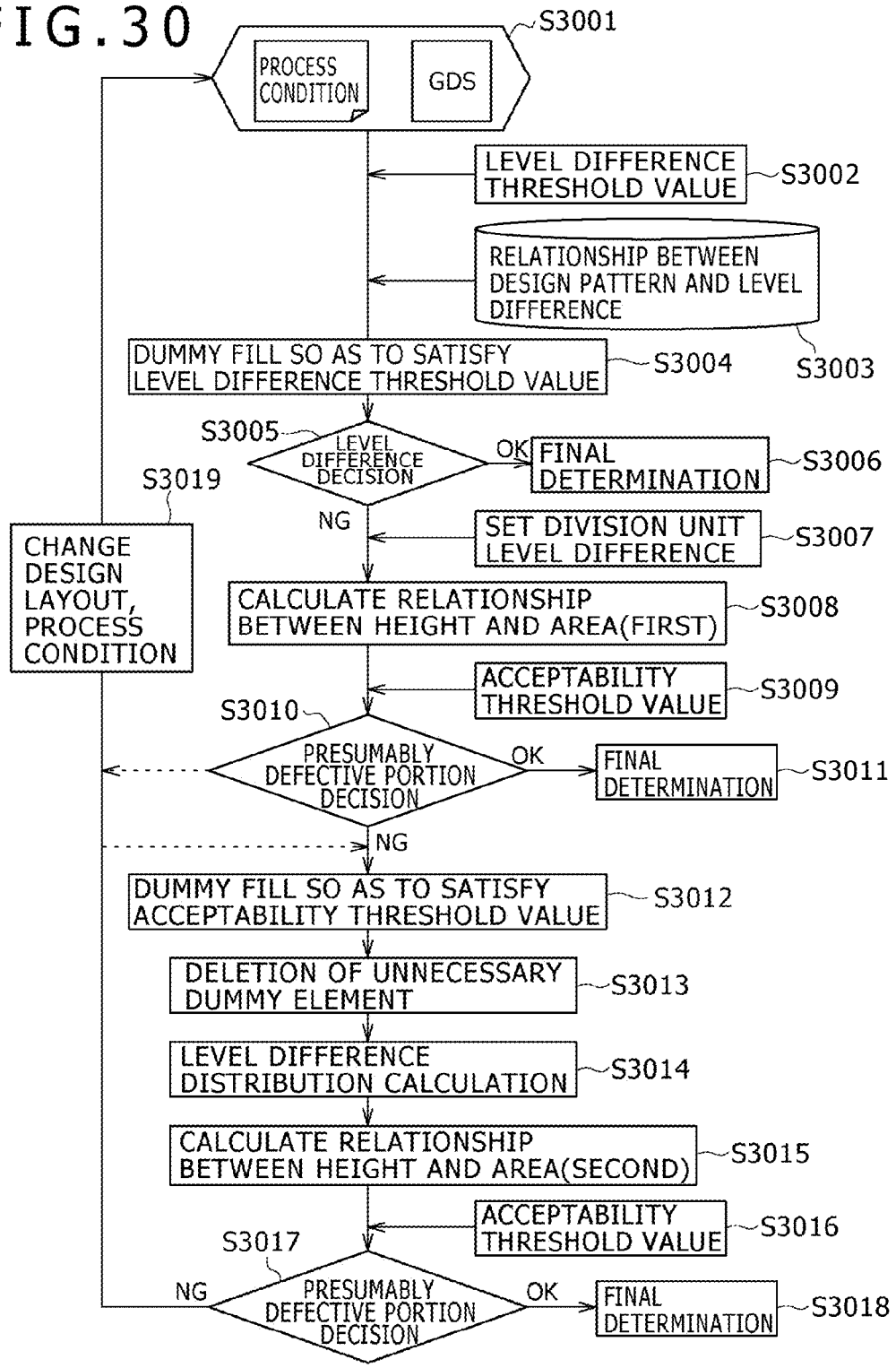
FIG. 30 is a flow chart illustrating a presumably defective portion decision process by a presumably defective portion decision apparatus according to a second example of the fifth embodiment of the present disclosure.

FIG. 30 is a flow chart illustrating a presumably defective portion decision process by the presumably defective portion decision apparatus according to a second example of the fifth embodiment.

The flow chart of FIG. 30 is different from the flow chart of FIG. 26 relating to the second example of the fourth embodiment in that it additionally includes steps S3004 and S3013.

Steps S3001 to S3003, S3005 to S3012 and S3014 to S3019 correspond to the steps S2601 to S2617 of FIG. 26, respectively.

Further, processes at steps S3001 to S3017 correspond to the processes at steps S2601 to S2617 of the flow chart of FIG. 26 relating to the second example of the fourth embodiment except a process at step S3003. In particular, they are different in the acquisition method of level difference data.

It is to be noted that the presumably defective portion decision apparatus which executes the flow chart of FIG. 30 can be configured by providing a design pattern-level difference relationship storage section 71 in addition to the components of the presumably defective portion decision apparatus 130-1 shown in FIG. 28.

Referring to FIG. 30, the arithmetic operation section 60 first acquires level difference data representative of a level difference distribution of the surface of a semiconductor device at steps S3001 to S3003. In the present example, the level difference data acquisition block 61 acquires level difference data from the design pattern-level difference relationship storage section 71.

Then, the dummy insertion block 66 carries out insertion of a dummy element, namely, dummy fill, into portions at which a level difference, for example, greater than 100 nm exists so that the design pattern after the dummy element insertion may satisfy the condition of the level difference threshold value at step S3004.

After the insertion of dummy elements, the level difference decision block 65 carries out a filtering process, namely, level difference decision, with regard to the depth of the level differences included in the level difference data at step S3005. The level difference decision block 65 decides whether or not the level difference data include a level difference greater or deeper than the level difference threshold value to extract those level differences which are greater than the level difference threshold value (NG at step S3005).

However, if the level difference data do not include a level difference greater than the level difference threshold value (OK at step S3005), then the layout and the process condition are finally determined at step S3006.

Then, the presumably defective portion decision block 62 carries out a presumably defective portion decision process for the first time with regard to the level differences extracted by the level difference decision block 65 at steps S3007 to S3010.

If no presumably defective portion is detected, then the layout and the process condition are finally determined at step S3011. On the other hand, if a presumably defective portion is detected, then the dummy insertion block 66 carries out a process of inserting an insertion element into the presumably defective portions of the layout so as to satisfy the condition of the acceptability threshold value at step S3012.

Then, if the dummy elements inserted at steps S3004 and S3012 include some unnecessary dummy element, the dummy deletion block 67 carries out a process of deleting such unnecessary dummy elements automatically or by manual operation at step S3013.

Then, the presumably defective portion decision block 62 carries out the presumably defective portion decision process for the second time with regard to the layout after the dummy element deletion process at steps S3014 to S3017. At step S3014, the level difference calculation block 64 calculates level difference data of the layout after the dummy element insertion process and the dummy element deletion process are carried out.

If no presumably defective portion is detected, then the layout and the process condition are finally determined at step S3018. On the other hand, if a presumably defective portion is detected, then the changing block 63 carries out a process of changing the layout and the process condition at step S3019.

With the second example of the fifth embodiment described above, the following working effects are exhibited in addition to the working effects exhibited by the second example of the fourth embodiment.

In the present embodiment, since a dummy element is disposed so as to satisfy the condition of the level difference threshold value, those level differences which are greater than the level difference threshold value decrease. Since the presumably defective portion decision process is carried out after such level differences which are greater than the level difference threshold value are decreased, the calculation amount can be suppressed and the processing tact can be reduced significantly.

Further, if the dummy element decision function is added such that both of insertion and deletion of a dummy element are carried out in combination, optimization of the dummy element and hence optimization of the layout can be implemented.

Furthermore, since it becomes possible to dispose only necessary dummy elements on the layout, reduction of the data amount of the entire layout and enhancement of the efficiency of the series of processes can be achieved.

5-3. Third Example

Case in which Level Difference Data are Acquired by Calculation

Figure 31:
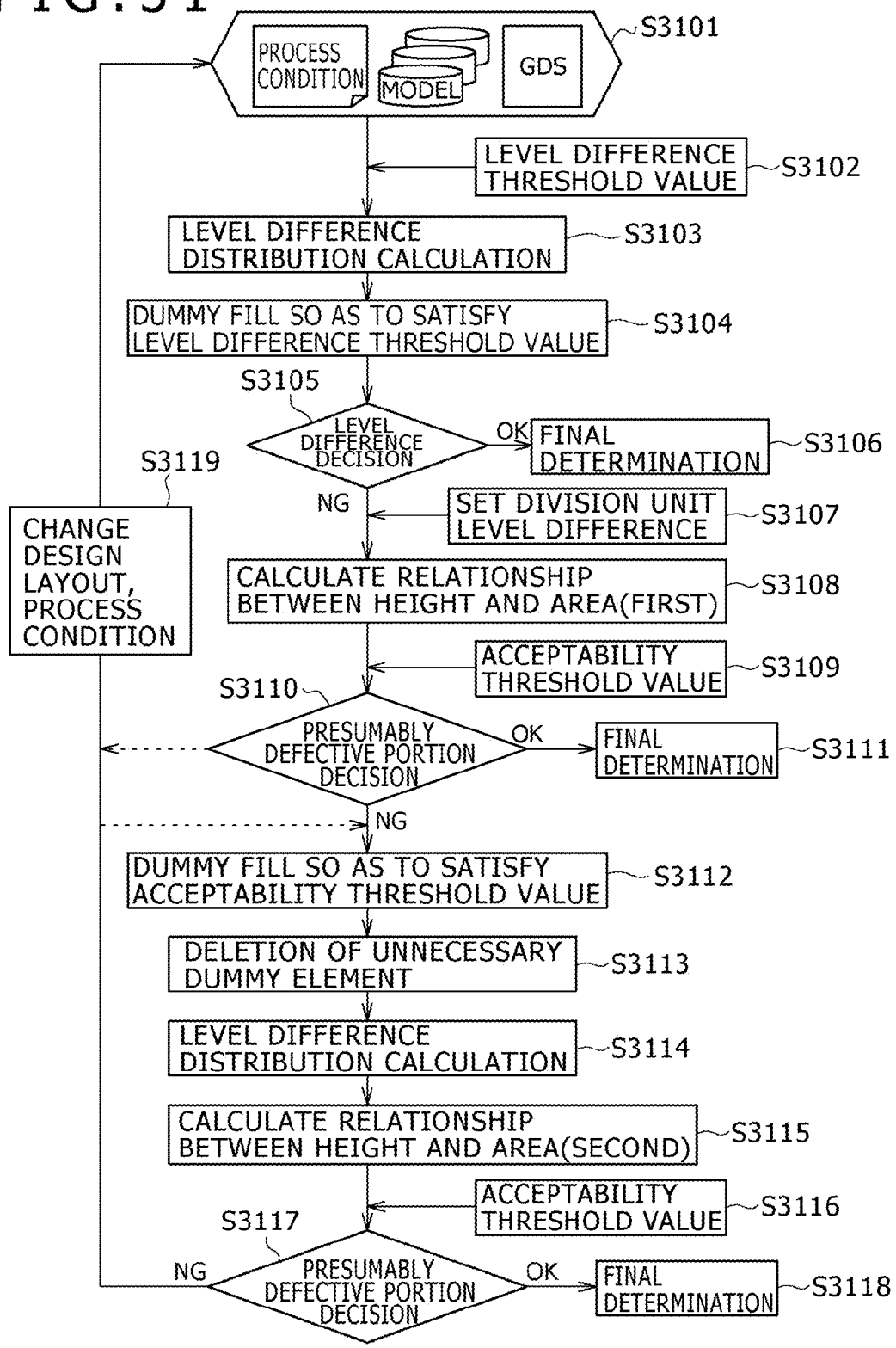
FIG. 31 is a flow chart illustrating a presumably defective portion decision process by a presumably defective portion decision apparatus according to a third example of the fifth embodiment of the present disclosure.

FIG. 31 is a flow chart illustrating a presumably defective portion decision process by a presumably defective portion decision apparatus according to a third example of the fifth embodiment.

The flow chart of FIG. 31 is different from the flow chart of FIG. 27 in the third example of the fourth embodiment in that it additionally includes steps S3104 and S3113.

Steps S3101 to S3103, S3105 to S3112 and S3114 to S3119 correspond to the steps S2701 to S2717 of FIG. 27, respectively.

Further, processes at steps S3101 to S3117 correspond to the processes at steps S2701 to S2717 of the flow chart of FIG. 27 in the second example of the fourth embodiment except a process at step S3103. In particular, they are different in the acquisition method of level difference data.

From the foregoing, overlapping detailed description of processes in FIG. 31 corresponding or similar to the other processes is omitted herein to avoid redundancy.

It is to be noted that the presumably defective portion decision apparatus which executes the flow chart of FIG. 31 can be configured by providing the design pattern-level difference relationship storage section 71 in addition to the components of the presumably defective portion decision apparatus 130-1 shown in FIG. 28.

Referring to FIG. 31, the arithmetic operation section 60 first acquires level difference data representative of a level difference distribution of the surface of a semiconductor device at steps S3101 to S3103. In the present example, the level difference data acquisition block 61 acquires level differences data from the design pattern-level difference relationship storage section 71.

Then, the dummy insertion block 66 carries out insertion of a dummy element, namely, dummy fill, into a portion at which a level difference, for example, greater than 100 nm exists so as to satisfy the condition of the level difference threshold value of the design pattern after the dummy element insertion process at step S3104.

After the insertion of a dummy element, the level difference decision block 65 carries out a filtering process, namely, level difference decision, with regard to the depth of the level differences included in the level difference data at step S3105. The level difference decision block 65 decides whether or not the level difference data include a level difference greater or deeper than the level difference threshold value to extract those level differences which are greater than the level difference threshold value (NG at step S3105).

If the level difference data do not include a level difference greater than the level difference threshold value (OK at step S3105), then the layout and the process condition are finally determined at step S3106.

Then, the presumably defective portion decision block 62 carries out a presumably defective portion decision process for the first time with regard to the level differences extracted by the level difference decision block 65 at steps S3107 to S3110.

If no presumably defective portion is detected, then the layout and the process condition are finally determined at step S3111.

If no presumably defective portion is detected, then the dummy insertion block 66 carries out a process of inserting a dummy element into such presumably defective portions of the layout so as to satisfy the condition of the acceptability threshold value at step S3112.

Then, when the dummy elements inserted at steps S3104 and S3112 include some unnecessary dummy element, the dummy deletion block 67 carries out a process of deleting such dummy elements automatically or by manual operation at step S3113.

Then, the presumably defective portion decision block 62 carries out the presumably defective portion decision process for the second time with regard to the layout after the dummy element deletion at steps S3114 to S3117. At step S3114, the level difference calculation block 64 calculates the level difference data of layout after the insertion process and the deletion process of a dummy element.

If no presumably defective portion is detected, then the arithmetic operation section 60 finally determines the layout and the process condition at step S3118. However, if a presumably defective portion is detected, then the changing block 63 carries out a process of changing the layout, process condition and so forth at step S3119.

With the third example of the fifth embodiment described above, the following working effects are exhibited in addition to the working effects exhibited by the third example of the fourth embodiment.

In the present embodiment, since a dummy element is disposed so as to satisfy the condition of the level difference threshold value, those level differences which are greater than the level difference threshold value decrease. Since the presumably defective portion decision process is carried out after such level differences which are greater than the level difference threshold value are decreased, the calculation amount can be suppressed and the processing tact can be reduced significantly.

Further, if the dummy element deletion function is added such that both of insertion and deletion of a dummy element are carried out in combination, optimization of the dummy element and hence optimization of the layout can be implemented.

Furthermore, since it becomes possible to dispose only necessary dummy elements on the layout, reduction of the data amount of the entire layout and enhancement of the efficiency of the series of processes can be achieved.

It is to be noted that the first to third examples of the fifth embodiment described hereinabove are characterized in that they include the dummy deletion block 67, but do not essentially require the level difference decision process by the level difference decision block 65.

6. Others

In the examples of the third to fifth embodiments which have a dummy element insertion process, when the value of the right side the expression (1) clearly is excessively higher than the acceptability threshold value at the presumably defective portion decision process step for the first time, the processing may advance to a changing process step of a design layout, a process condition and so forth as indicated by a broken line portion to modify the process condition by a great amount by the changing block 63.

Further, in the examples of the third to fifth embodiments, the processing may advance from the presumably defective portion decision process step for the second time to the dummy element insertion process step as indicated by a broken line such that, as a process for the presumably defective portions extracted by the presumably defective portion decision process for the second time, the dummy element insertion is carried out again by the dummy insertion block 66. In this instance, the flatness of the semiconductor device surface can be raised by a smaller amount of design change.

Further, while it is described in the foregoing description of the examples of the first to fifth embodiments, the changing block 63 suitably carries out change of the layout and the process condition, the change of the layout includes correction of the design pattern, proximity effect correction, and insertion and deletion of a dummy element.

It is to be noted that the present disclosure can take such configurations as described below.

(1)

A presumably defective portion decision apparatus, including an arithmetic operation section configured to divide a level difference included in level difference data which indicate a level difference distribution on the surface of a semiconductor device into two or more unit level differences in the depthwise direction of the level difference and determine, for each of the unit level differences obtained by the division, a relationship between the height of a contour line at a level difference position of an upper face and an area of an opening surrounded by the contour line to decide presence or absence of a presumably defective portion.

(2)

The presumably defective portion decision apparatus according to (1) above, wherein the arithmetic operation section includes:

a level difference data acquisition block configured to acquire the level difference data which indicates the level difference distribution of the semiconductor device surface; and a presumably defective portion decision block configured to set at least one or more level difference positions in the depthwise direction with respect to a level difference included in the acquired level difference data and divide the level difference into two or more unit level differences based on the one or more level difference positions and then apply, for each of the unit level differences, the height from the deepest portion of the level difference of a contour line at the level difference position of the upper face and an area of an opening surrounded by the contour line to a conditional expression and decide presence or absence of a presumably defective portion based on whether or not the conditional expression is satisfied.

(3)

The presumably defective portion decision apparatus according to (1) above, wherein the dividing number into unit level differences in the depthwise direction of a level difference included in the level difference data is increased in response to the depth of the level difference.

(4)

The presumably defective portion decision apparatus according to (2) above, wherein the presumably defective portion decision block decides that there is a presumably defective portion when, where the height of the contour line at a first level difference position of the upper face of a first unit level difference which configures the divided level differences is represented by hi, the area of the opening surrounded by the contour line by Si, the height of the contour line at a second level difference position of the upper face of a second adjacent unit level difference by hi+1, the area of the opening surrounded by the contour line by Si+1 and an acceptability threshold value used for decision of a presumably defective portion by D, the value on the right side of the following conditional expression:

$$D > (h_{i+1} - h_i) / \{\sqrt{(S_{i+1})} - \sqrt{(S_i)}\}$$

is higher than the acceptability threshold value D on the left side.

(5)

The presumably defective portion decision apparatus according to (2) or (4) above, further including a level difference decision block configured to compare the depth from a reference face to the deepest portion of the level difference included in the level difference data and a level difference threshold value to decide presence or absence of a level difference having a value higher than the level difference threshold value to extract those level differences which have a value higher than the level difference threshold value; wherein the presumably defective portion decision block decides presence or absence of a presumably defective portion using the conditional expression with regard to the level difference extracted by the level difference decision block.

(6)

The presumably defective portion decision apparatus according to (4) or (5) above, further including:

a dummy insertion block configured to set insertion of a dummy element to a portion decided as a presumably defective portion on a layout based on the decision by the presumably defective portion decision block; and a level difference calculation block configured to calculate a level difference distribution on the semiconductor device surface after the insertion of the dummy element; wherein the presumably defective portion decision block decides presence or absence of a presumably defective portion using the conditional expression with regard to the level difference in the level difference distribution calculated by the level difference calculation block.

(7)

The presumably defective portion decision apparatus according to (4) above, further including:

a level difference decision block configured to compare the depth from the reference face to the deepest portion of the level difference included in the level difference data and a level difference threshold value with each other to decide presence or absence of a level difference having a value higher than the level difference threshold value to extract those level differences which have a value higher than the level difference threshold value;

a dummy insertion block configured to set insertion of a dummy element to a portion decided as a presumably defective portion on a layout by the presumably defective portion decision block from among level differences extracted by the level difference decision block; and a level difference calculation block configured to calculate a level difference distribution on the semiconductor device surface after insertion of the dummy element; wherein the presumably defective portion decision block decides presence or absence of a presumably defective portion using the conditional expression with regard to the level difference in the level difference distribution calculated by the level difference calculation block.

(8)

The presumably defective portion decision apparatus according to (6) or (7) above, further including:

a dummy deletion block configured to delete an unnecessary dummy element on the layout after insertion of the dummy element by the dummy insertion block; and a level difference calculation block configured to calculate a level difference distribution on the semiconductor device surface after deletion of the dummy element; wherein the presumably defective portion decision block decides presence or absence of a presumably defective portion using the conditional expression with regard to the level difference in the level difference distribution calculated by the level difference calculation block.

(9)

The presumably defective portion decision apparatus according to any one of (2) to (8) above, further including a changing block configured to change, when there is a presumably defective portion as a result of the decision by the presumably defective portion decision block, at least one of the layout of the semiconductor device and a process condition such that the conditional expression is satisfied.

(10)

The presumably defective portion decision apparatus according to any one of (2) to (9) above, wherein the level difference data acquisition block acquires the level difference data from an actual measurement value of the semiconductor device surface after polishing, acquiring the level difference data from a database which includes a relationship between a design pattern and a level difference, or acquiring the level difference data calculated from the layout and a process model.

(11)

A presumably defective portion decision method, including:

dividing a level difference included in level difference data which indicate a level difference distribution on the surface of a semiconductor device into two or more unit level differences in the depthwise direction of the level difference; and determining, for each of the unit level differences obtained by the division, a relationship between the height of a contour line at a level difference position of an upper face and an area of an opening surrounded by the contour line to decide presence or absence of a presumably defective portion.

(12)

A fabrication method for a semiconductor device, including:

dividing a level difference included in level difference data which indicate a level difference distribution on the surface of a semiconductor device into two or more unit level differences in the depthwise direction of the level difference;

determining, for each of the unit level differences obtained by the division, a relationship between the height of a contour line at a level difference position of an upper face and an area of an opening surrounded by the contour line to decide presence or absence of a presumably defective portion;

changing, where a presumably defective portion is detected as a result of the decision, at least one of the layout and a process condition of the semiconductor device such that a relationship between the height of the contour line for each of the divisional unit level differences and an area of an opening surrounded by the contour line satisfies a predetermined relationship; and flattening the semiconductor device based on the layout or the process condition after the change.

(13)

A program for causing a computer to execute:

a process of dividing a level difference included in level difference data which indicate a level difference distribution on the surface of a semiconductor device into two or more unit level differences in the depthwise direction of the level difference; and a process of determining, for each of the unit level differences obtained by the division, a relationship between the height of a contour line at a level difference position of an upper face and an area of an opening surrounded by the contour line to decide presence or absence of a presumably defective portion.

It is to be noted that, in the case where the series of processes in the first to fifth embodiments described above can be executed by hardware, a program which configures the software can be executed by a computer wherein the program is incorporated in hardware for exclusive use or by a computer in which programs for executing various functions are installed. For example, a program which configures desired software may be installed into and executed by a personal computer for universal use.

Further, a recording medium in which program codes of software which implements the functions of the embodiments described hereinabove are recorded may be supplied to the system or apparatus. Naturally, the functions are implemented also by a computer of the system or the apparatus, or by a control device such as a CPU, which reads out and executes the program codes stored in the recording medium.

As the recording medium for supplying the program codes in this instance, for example, a flexible disk, a hard disk, an optical disk, a magneto-optical disk, a CD-ROM, a CD-R, a magnetic tape, a nonvolatile memory card, a ROM and so forth can be used.

Further, the functions of the embodiments described hereinabove are implemented by a computer which executes read out program codes. In addition, based on an instruction of the program codes, an OS or the like operating on the computer carries out part or the entirety of actual processing. Also a case in which the functions of the embodiments described above are implemented by the processing is included in the present disclosure.

Further, in the present specification, the processing steps which describe time-series processes include not only processes carried out in a time series in accordance with the described order but also processes which are executed in parallel or individually such as, for example, parallel processes or processes depending upon objects even if the processes are not necessarily processed in a time series. Further, the execution order of some processing steps may be changed if this does not have an influence on the overall processing.

It is to be noted that, although the first to fifth embodiments described above have the configuration wherein the series of processes are executed by software, also it is possible to execute all or some of the processes by hardware.

The present disclosure is not limited to the embodiments described above but allows various other modifications and applications without departing from the subject matter of the present disclosure described in the claims.

In particular, since the embodiments described above are preferred forms in embodying the present disclosure, various technically preferable restrictions are applied. However, the technical scope of the present disclosure is not limited to the embodiments unless otherwise specified that the present disclosure is restricted. For example, described above, the used materials and used amounts of them, processing time periods, processing orders, numerical conditions of the parameters and so forth are mere preferable examples, and also the dimensions, shapes and arrangement relationships in the figures referred to in the description are schematic ones.

The present disclosure contains subject matter related to that disclosed in Japanese Priority Patent Application JP 2012-017041 filed in the Japan Patent Office on Jan. 30, 2012, the entire content of which is hereby incorporated by reference.

What is claimed is:

1. A defective portion decision apparatus, comprising:
one or more processors operable to:
divide a level difference, which indicates a level difference distribution on a surface of a semiconductor device, into two or more unit level differences in a depthwise direction of the level difference;
generate a contour line diagram of the level difference for each of the two or more unit level differences based on position coordinates acquired for each of the two or more unit level differences;
determine, for each of the divided two or more unit level differences, a relationship between height of each of the divided two or more unit level differences, from a predetermined position of the level difference, and a corresponding area of each opening surrounded by a contour line formed using each of the divided two or more unit level differences in the generated contour line diagram,
wherein the relationship is a value obtained by computing a difference between heights of two consecutive unit level differences divided by a difference between square roots of corresponding areas of opening surrounded by the contour lines; and
decide presence or absence of the defective portion on the surface of the semiconductor device based on comparison of the computed value against a predetermined threshold value.

2. The defective portion decision apparatus according to claim 1, wherein the one or more processors are operable to:
acquire level difference data which indicates the level difference distribution on the surface of the semiconductor device;
set one or more level difference positions in the depthwise direction of the level difference included in the acquired level difference data;
divide the level difference into the two or more unit level differences based on the one or more level difference positions;
determine, for each of the divided two or more unit level differences, a relationship between the height of the one or more level difference positions, from the predetermined position of the level difference, and the corresponding area of the opening surrounded by the contour line, formed using each of the divided two or more unit level differences, to form a conditional expression comprising the computed value and the predetermined threshold value; and
decide presence or absence of the defective portion on the surface of the semiconductor device based on whether or not the conditional expression is satisfied.

3. The defective portion decision apparatus according to claim 2, wherein the one or more processors are operable to:
increase a division number of the division of the level difference, included in the level difference data, in response to increase in depth of the level difference.

4. The defective portion decision apparatus according to claim 2, wherein the one or more processors are operable to:
decide presence or absence of the defective portion on the surface, when the height of a first level difference position of an upper face of a first unit level difference, which configures the divided two or more unit level differences, is represented by $h_i$, the corresponding area of the opening surrounded by the contour line, formed in the generated contour line diagram using the first unit level difference, is represented by $S_i$, the height of a second level difference position of an upper face of a second adjacent unit level difference is represented by $h_{i+1}$ the corresponding area of the opening surrounded by the contour line, formed in the generated contour line diagram using second adjacent unit level difference is represented by $S_{i+1}$, and the predetermined threshold value used for decision of the defective portion is represented by D, the computed value on right side of the conditional expression represented by:

$$D > (h_{i+1} - h_i) / \{\sqrt{(S_{i+1})} - \sqrt{(S_i)}\};$$

is higher than the threshold value D on left side.

5. The defective portion decision apparatus according to claim 4, wherein the one or more processors are operable to:
compare depth, from a reference face to the predetermined position of the level difference, included in the level difference data and the predetermined threshold value to decide presence or absence of the defective portion on the surface; and
extract the two or more unit level differences which have the defective portion,
wherein presence or absence of the defective portion on the surface is decided using the conditional expression.

6. The defective portion decision apparatus according to claim 4, wherein the one or more processors are operable to:
insert an element to a portion decided as the defective portion of a layout on the surface of the semiconductor device; and
calculate the level difference distribution on the surface of the semiconductor device after the insertion of the element.

7. The defective portion decision apparatus according to claim 4, wherein the one or more processors are operable to:
compare the depth, from a reference face to the predetermined position of the level difference, included in the level difference data, and the predetermined threshold value to decide presence or absence of the defective portion on the surface;
extract the two or more level differences which have the defective portion;
insert an element to a portion decided as the defective portion of a layout on the surface of the semiconductor device; and
calculate the level difference distribution on the surface of the semiconductor device after insertion of the element.

8. The defective portion decision apparatus according to claim 4, wherein the one or more processors are operable to:
insert an element to a portion decided as the defective portion of a layout on the surface of the semiconductor device;
delete the element on the layout after insertion of the element; and
calculate the level difference distribution on the surface of the semiconductor device after deletion of the element.

9. The defective portion decision apparatus according to claim 4, wherein the one or more processors are operable to:
change, when presence of the defective portion is decided, at least one of a layout of the semiconductor device and a process condition such that the conditional expression is satisfied.

10. The defective portion decision apparatus according to claim 1, wherein the one or more processors are operable to:
acquire level difference data, from an actual measurement value of the surface of the semiconductor device, after polishing; and
acquire the level difference data from a database, which includes a relationship between a layout and the level difference, or acquire the level difference data calculated from the layout and a process model.

11. The defective portion decision apparatus according to claim 1, wherein the contour line is formed by connecting two or more level difference positions positioned at same height from the predetermined position of the level difference.

12. The defective portion decision apparatus according to claim 1, wherein the predetermined threshold value for each of the two or more unit level differences is determined based on depth of the level difference, and wherein the depth of the level difference is the height of the level difference measured from the predetermined position.

13. A defective portion decision method, comprising:
in one or more processors:
dividing a level difference, which indicates a level difference distribution on a surface of a semiconductor device, into two or more unit level differences in depthwise direction of the level difference;
generating a contour line diagram of the level difference for each of the two or more unit level differences based on position coordinates acquired for each of the two or more unit level differences;
determining, for each of the divided two or more unit level differences, a relationship between height of each of the divided two or more unit level differences, from a predetermined position of the level difference, and a corresponding area of each opening surrounded by a contour line formed using each of the divided two or more unit level differences in the generated contour line diagram,
wherein the relationship is a value obtained by computing a difference between heights of two consecutive unit level differences divided by a difference between square roots of corresponding areas of opening surrounded by the contour lines; and
deciding presence or absence of the defective portion on the surface of the semiconductor device based on comparison of the computed value against a predetermined threshold value.

14. A fabrication method for a semiconductor device, comprising:
dividing a level difference, which indicates a level difference distribution on a surface of a semiconductor device, into two or more unit level differences in depthwise direction of the level difference;
generating a contour line diagram of the level difference for each of the two or more unit level differences based on position coordinates acquired for each of the two or more unit level differences;
determining, for each of the divided two or more unit level differences, a relationship between height of each of the divided two or more unit level differences, from a predetermined position of the level difference, and a corresponding area of each opening surrounded by a contour line formed using each of the divided two or more unit level differences in the generated contour line diagram,
wherein the relationship is a value obtained by computing a difference between heights of two consecutive unit level differences divided by a difference between square roots of corresponding areas of opening surrounded by the contour lines;
deciding presence or absence of the defective portion on the surface of the semiconductor device based on comparison of the computed value against a predetermined threshold value;
changing, where the defective portion is detected as a result of the decision, at least one of a layout and a process condition of the semiconductor device such that the relationship satisfies a predetermined relationship; and
flattening the semiconductor device based on the changed layout or the changed process condition.

15. A non-transitory computer readable medium having stored thereon, a set of computer-executable instructions for causing the computer to perform steps comprising:
dividing a level difference, which indicates a level difference distribution on a surface of a semiconductor device, into two or more unit level differences in depthwise direction of the level difference;
generating a contour line diagram of the level difference for each of the two or more unit level differences based on position coordinates acquired for each of the two or more unit level differences;
determining, for each of the divided two or more unit level differences, a relationship between the height of each of the divided two or more unit level differences, from a predetermined position of the level difference, and a corresponding area of an opening surrounded by a contour line, formed using each of the divided two or more unit level differences in the generated contour line diagram,
wherein the relationship is a value obtained by computing a difference between heights of two consecutive unit level differences divided by a difference between square roots of corresponding areas of opening surrounded by the contour lines; and
deciding presence or absence of the defective portion on the surface of the semiconductor device based on comparison of the computed value against a predetermined threshold value.

* * * * *